United States Patent
Arai et al.

(10) Patent No.: US 10,529,412 B1
(45) Date of Patent: Jan. 7, 2020

(54) OUTPUT BUFFER CIRCUIT WITH NON-TARGET ODT FUNCTION

(71) Applicant: MICRON TECHNOLOGY, INC., Boise, ID (US)

(72) Inventors: Tetsuya Arai, Kanagawa (JP); Junki Taniguchi, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/379,635

(22) Filed: Apr. 9, 2019

(51) Int. Cl.
| | |
|---|---|
| G11C 11/40 | (2006.01) |
| H03K 19/177 | (2006.01) |
| G11C 11/4093 | (2006.01) |
| H03H 11/28 | (2006.01) |
| G11C 11/4096 | (2006.01) |
| H03K 19/00 | (2006.01) |
| H03K 3/037 | (2006.01) |
| H03K 19/094 | (2006.01) |

(52) U.S. Cl.
CPC ...... *G11C 11/4093* (2013.01); *G11C 11/4096* (2013.01); *H03H 11/28* (2013.01); *H03K 3/0372* (2013.01); *H03K 19/0013* (2013.01); *H03K 19/09425* (2013.01); *H03K 19/17772* (2013.01); *H03K 19/17784* (2013.01)

(58) Field of Classification Search
CPC ........... H03K 3/35625; H03K 19/0013; H03K 19/0016; H03K 19/00384; H03K 19/094; G11C 15/04; G11C 7/1048; G11C 11/4093; G11C 11/4096; H03H 11/28
See application file for complete search history.

(56) References Cited

U.S. PATENT DOCUMENTS

| | | | | |
|---|---|---|---|---|
| 6,963,226 | B2 * | 11/2005 | Chiang | H03K 3/356113 326/68 |
| 7,525,362 | B1 * | 4/2009 | Lesea | H03K 3/0375 327/208 |
| 7,863,930 | B2 * | 1/2011 | Nishioka | H03K 19/17784 326/101 |
| 9,331,680 | B2 * | 5/2016 | Gurumurthy | H03K 3/35625 |
| 2004/0196724 | A1 * | 10/2004 | Chen | G11C 11/4074 365/230.05 |
| 2006/0017467 | A1 * | 1/2006 | Lai | H03K 19/0016 326/112 |

(Continued)

*Primary Examiner* — Vibol Tan
(74) *Attorney, Agent, or Firm* — Dorsey & Whitney LLP

(57) ABSTRACT

Disclosed herein is an apparatus that includes: a data terminal; a first output transistor connected between the data terminal and a first power line supplying a first power potential; a first tristate circuit including an output node connected to a control electrode of the first output transistor, a first pull-up transistor configured to drive the output node to a first logic level, and a first pull-down transistor configured to drive the output node to a second logic level; and a second tristate circuit including an output node connected to the control electrode of the first output transistor, a second pull-up transistor configured to drive the output node to the first logic level, and a second pull-down transistor configured to drive the output node to the second logic level. The second pull-up and pull-down transistors have a different threshold voltage from the first pull-up and pull-down transistors.

17 Claims, 15 Drawing Sheets

(56) References Cited

U.S. PATENT DOCUMENTS

2010/0148820 A1* 6/2010 Nishioka .......... H03K 19/17772
                                                          326/39
2013/0342238 A1    12/2013 Arai
2017/0214403 A1     7/2017 Arai et al.
2017/0366184 A1* 12/2017 Arai .................. H03K 19/0013

* cited by examiner

OUTPUT BUFFER CIRCUIT WITH NON-TARGET ODT FUNCTION

BACKGROUND

Semiconductor devices such as a DRAM have an ODT function that makes an output buffer function as a terminating resistor. In recent years, there is a case where a transistor with a low threshold is used in a circuit in a preceding stage of an output buffer to increase the speed of a data path to the output buffer. Therefore, when such a semiconductor device performs a non-target ODT operation for making the output buffer function as a terminating resistor while the semiconductor device is in a non-selected state, there is a problem that a leak current is increased while the semiconductor device is in a non-selected state.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
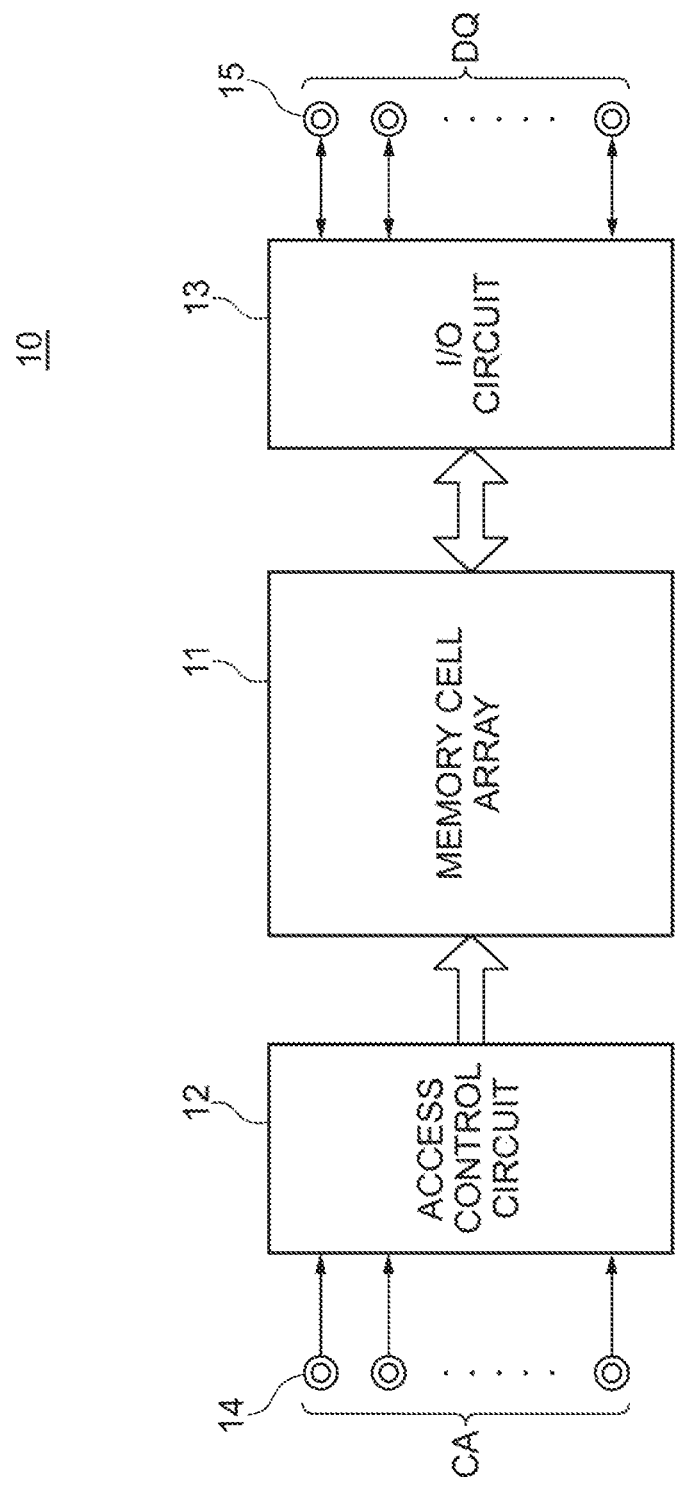
FIG. 1 is a block diagram showing a configuration of a semiconductor device according to the present disclosure.

A semiconductor device 10 shown in FIG. 1 is an LPDDR5 (Low-Power Double Data Rate 5) DRAM, for example, and has a memory cell array 11, an access control circuit 12 that makes access to the memory cell array 11, and an I/O circuit 13 that inputs data to and outputs data from the memory cell array 11. The access control circuit 12 makes access to the memory cell array 11 based on a command address signal CA input from an external controller via a command address terminal 14. In a read operation, data DQ read out from the memory cell array 11 is output to a data terminal 15 via the I/O circuit 13. In a write operation, data DQ input to the data terminal 15 from the external controller is supplied to the memory cell array 11 via the I/O circuit 13. Further, in an ODT operation, an output buffer included in the I/O circuit 13 functions as a terminating resistor.

Figure 2A:
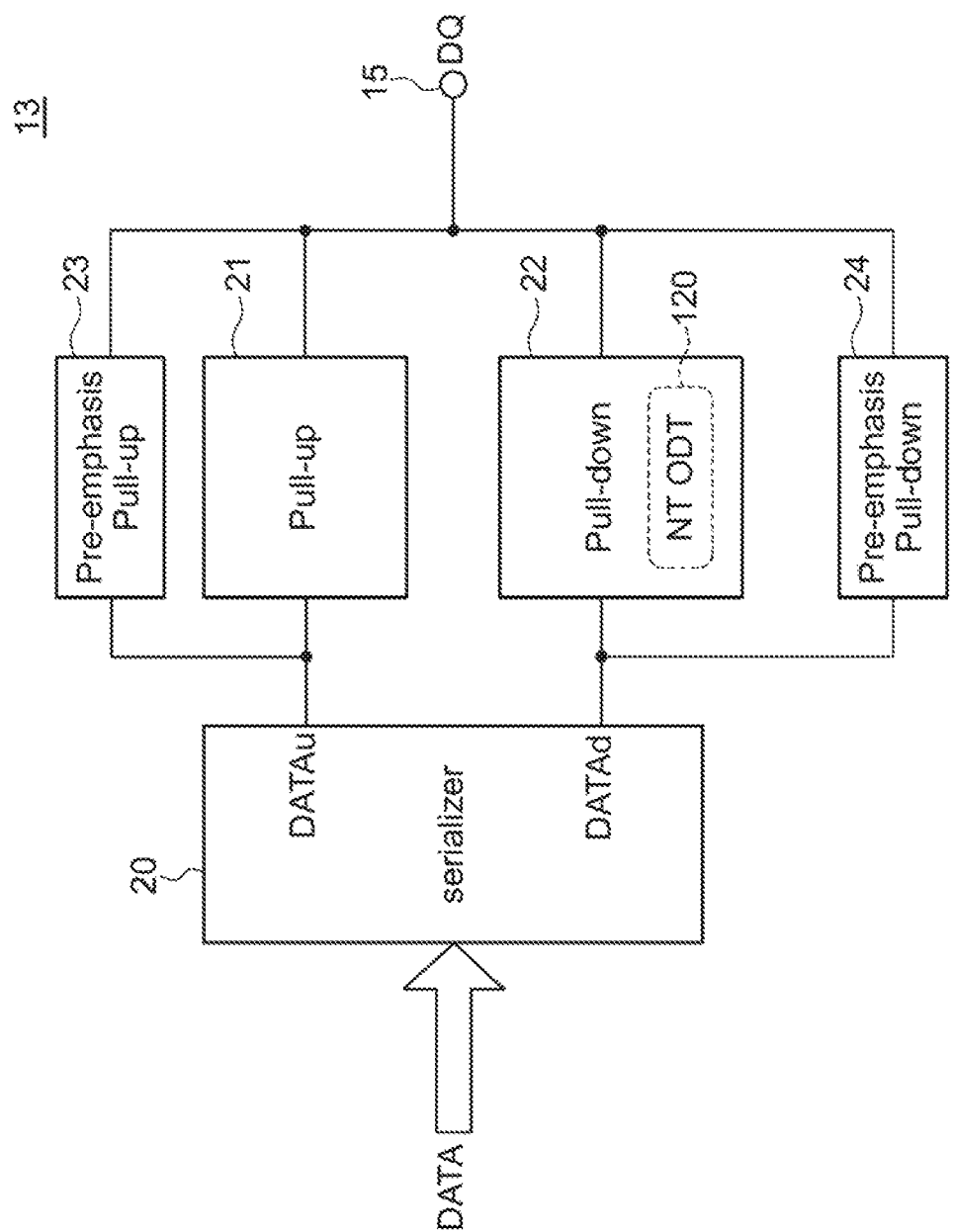
FIG. 2A is a block diagram showing a circuit of a data output system included in an I/O circuit.

FIG. 2A shows circuit blocks of a data output system included in the I/O circuit 13, which are associated with one data terminal 15. As shown in FIG. 2A, the I/O circuit 13 includes a serializer 20 that converts parallel data DATA read out from the memory cell array 11 to serial data. The serial data output from the serializer 20 includes pull-up data DATAu and pull-down data DATAd. The pull-up data DATAu and the pull-down data DATAd are signals that are complementary to each other.

Figure 2B:
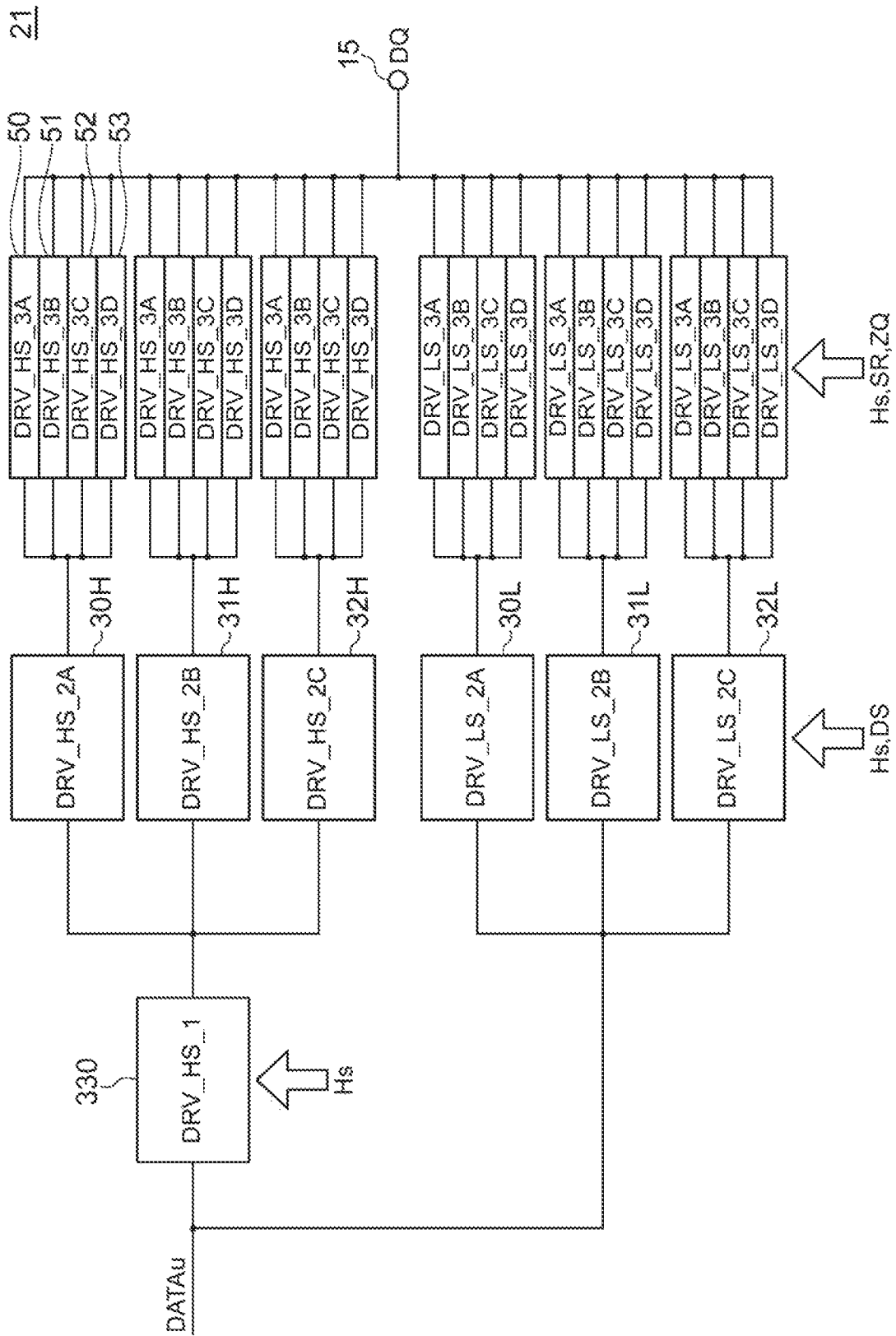
FIG. 2B is a block diagram showing a configuration of a pull-up circuit.

The pull-up data DATAu is supplied to a pull-up circuit 21 and a pre-emphasis circuit 23. The pull-up circuit 21 is activated in a pull-up operation, that is, when high-level read data DQ is output from the data terminal 15. As shown in FIG. 2B, the pull-up circuit 21 includes three pull-up driver circuits 30H to 32H that belong to a high-speed path and three pull-up driver circuits 30L to 32L that belong to a low-speed path. Whether to use the high-speed path or the low-speed path is selected based on a speed mode signal Hs input to a driver circuit 330. In a case where the high-speed path is selected, one or two or more of the pull-up driver circuits 30H to 32H is/are selected based on a driver-strength selection signal DS. In a case where the low-speed path is selected, one or two or more of the pull-up driver circuits 30L to 32L is/are selected based on the driver-strength selection signal DS. The driver sizes of the pull-up driver circuits 30H to 32H may be different from one another. Similarly, the driver sizes of the pull-up driver circuits 30L to 32L may be different from one another. Each of the pull-up driver circuits 30H to 32H and 30L and 32L includes output impedance calibration circuits 50 to 53. These output impedance calibration circuits equally and selectively drive adjustment MOS transistors included in a plurality of output-stage circuits that have an equal impedance to one another based on an impedance selection signal ZQ in such a manner that an impedance per one output-stage circuit is calibrated to a desired value. The number of associated output-stage circuits is different among the pull-up driver circuits 30H/L to 32H/L. For example, the circuit 30H/L is associated with three output-stage circuits, the circuit 31H/L is associated with two output-stage circuits, and the circuit 32H/L is associated with one output-stage circuit in this case, each of the output impedance calibration circuits 50 to 53 in the circuit 30H/L drives adjustment MOS transistors of three output-stage circuits, each of the output impedance calibration circuits 50 to 53 in the circuit 31H/L drives adjustment MOS transistors of two output-stage circuits, and each of the output impedance calibration circuits 50 to 53 in the circuit 32H/L drives an adjustment MOS transistor of one output-stage circuit. Therefore, it is possible to select an output impedance in a pull-up operation to be an accurate impedance with desired driver strength. In addition, the speed mode signal Hs and a slew-rate selection signal SR are also supplied to the output impedance calibration circuits 50 to 53 in common.

Figure 2C:
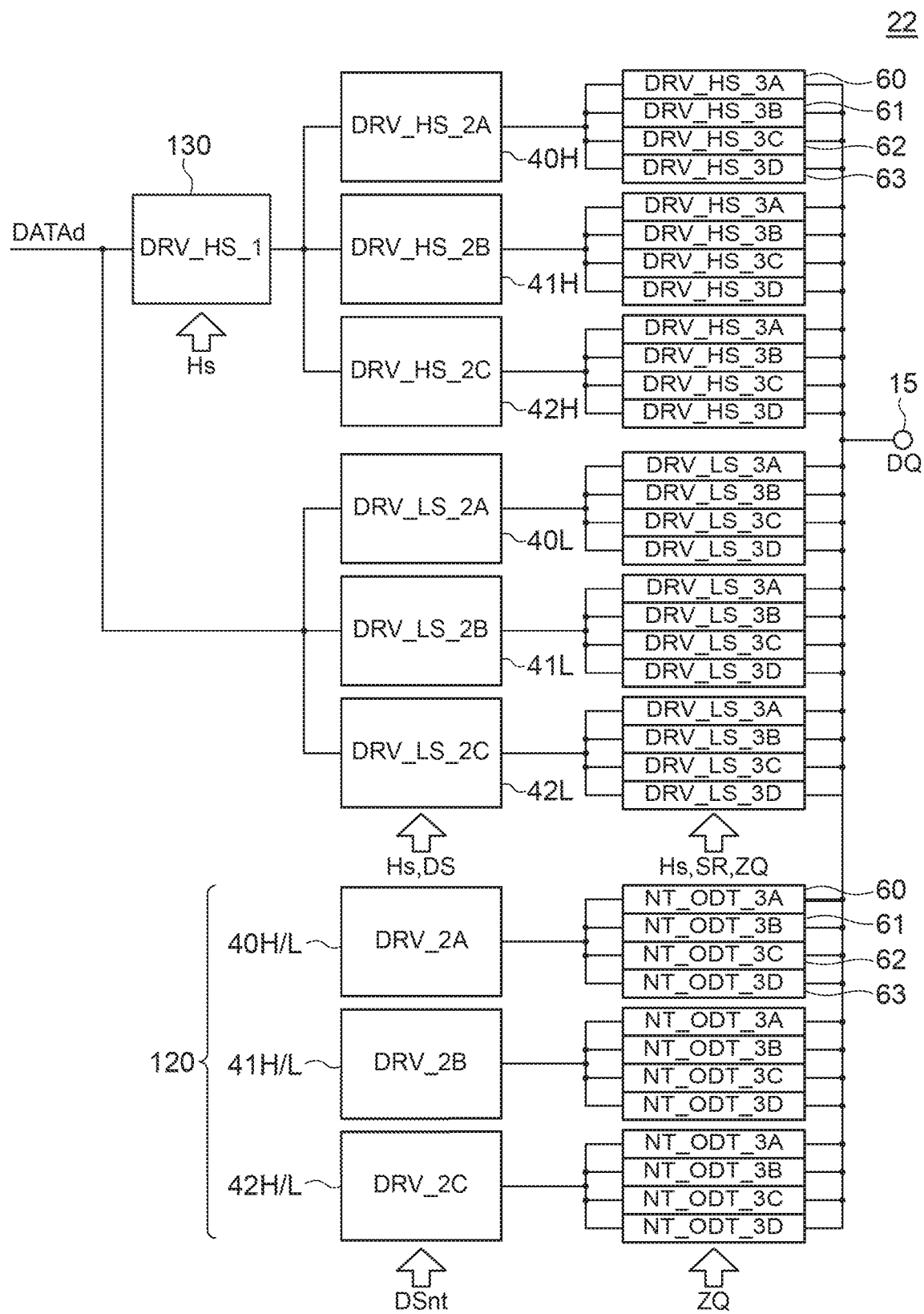
FIG. 2C is a block diagram showing a configuration of a pull-down circuit.

The pull-down data DATAd is supplied to a pull-down circuit 22 and a pre-emphasis circuit 24. The pull-down circuit 22 is activated in a pull-down operation, that is, when low-level read data DQ is output from the data terminal 15. Further, a driver circuit 120 included in the pull-down circuit 22 is activated when a non-target ODT operation is performed. As shown in FIG. 2C, the pull-down circuit 22 includes three pull-down driver circuits 40H to 42H that belong to a high-speed path and three pull-down driver circuits 40L to 42L that belong to a low-speed path. FIG. 2C also shows the driver circuit 120 that performs a non-target ODT operation. Whether to use the high-speed path or the low-speed path is selected based on the speed mode signal Hs input to a driver circuit 130. In a case where the high-speed path is selected, one or two or more of the pull-down driver circuits 40H to 42H is/are selected based on the driver-strength selection signal DS. In a case where the low-speed path is selected, one or two or more of the pull-down driver circuits 40L to 42L is/are selected based on the driver-strength selection signal DS. The driver sizes of the pull-down driver circuits 40H to 42H may be different from one another. Similarly, the driver sizes of the pull-down driver circuits 40L to 42L may be different from one another. Each of the pull-down driver circuits 40H to 42H and 40L and 42L includes output impedance calibration circuits 60 to 63. These output impedance calibration circuits equally and selectively drive adjustment MOS transistors included in a plurality of output-stage circuits that have an equal impedance to one another based on the impedance selection signal ZQ in such a manner that an impedance per one output-stage circuit is calibrated to a desired value. The number of the associated output-stage circuits is different among the pull-down driver circuits 40H/L to 42H/L. For example, the circuit 40H/L is associated with three output-stage circuits, the circuit 41H/L is associated with two output-stage circuits, and the circuit 42H/L is associated with one output-stage circuit. In this case, each of the output impedance calibration circuits 60 to 63 in the circuit 40H/L drives adjustment MOS transistors of three output-stage circuits, each of the output impedance calibration circuits 60 to 63 in the circuit 41H/L drives adjustment MOS transistors of two output-stage circuits, and each of the output impedance calibration circuits 60 to 63 in the circuit 42H/L drives an adjustment MOS transistor of one output-stage circuit. Therefore, it is possible to select an output impedance in a pull-down operation to be an accurate impedance with desired driver strength. In addition, the speed mode signal Hs and the slew-rate selection signal SR are also supplied to the output impedance calibration circuits 60 to 63 in common.

The pull-down circuit 22 includes the driver circuit 120 for performing a non-target ODT operation. The driver circuit 120 is configured by a portion of the pull-down driver circuits 40H/L to 42H/L and a portion of the output impedance calibration circuits 60 to 63, and is activated when a non-target ODT operation is performed, regardless of the speed mode signal Hs. Which of the pull-down driver circuits 40H/L to 42H/L is activated in a non-target ODT operation is selected based on a driver-strength selection signal DSnt that is exclusive for the non-target ODT operation. The impedances of the output impedance calibration circuits 60 to 63 in a non-target ODT operation are specified by the impedance selection signal ZQ.

Each of the pre-emphasis circuits 23 and 24 temporarily lowers its output resistance only during a period of data transition, thereby compensating for loss by the skin effect and dielectric loss generated in a high-frequency operation. Therefore, it is possible to allow data transition to occur with an appropriate slew rate even in a high-frequency operation and to drive the data terminal 15 with a set resistance in a steady state.

Figure 2D:
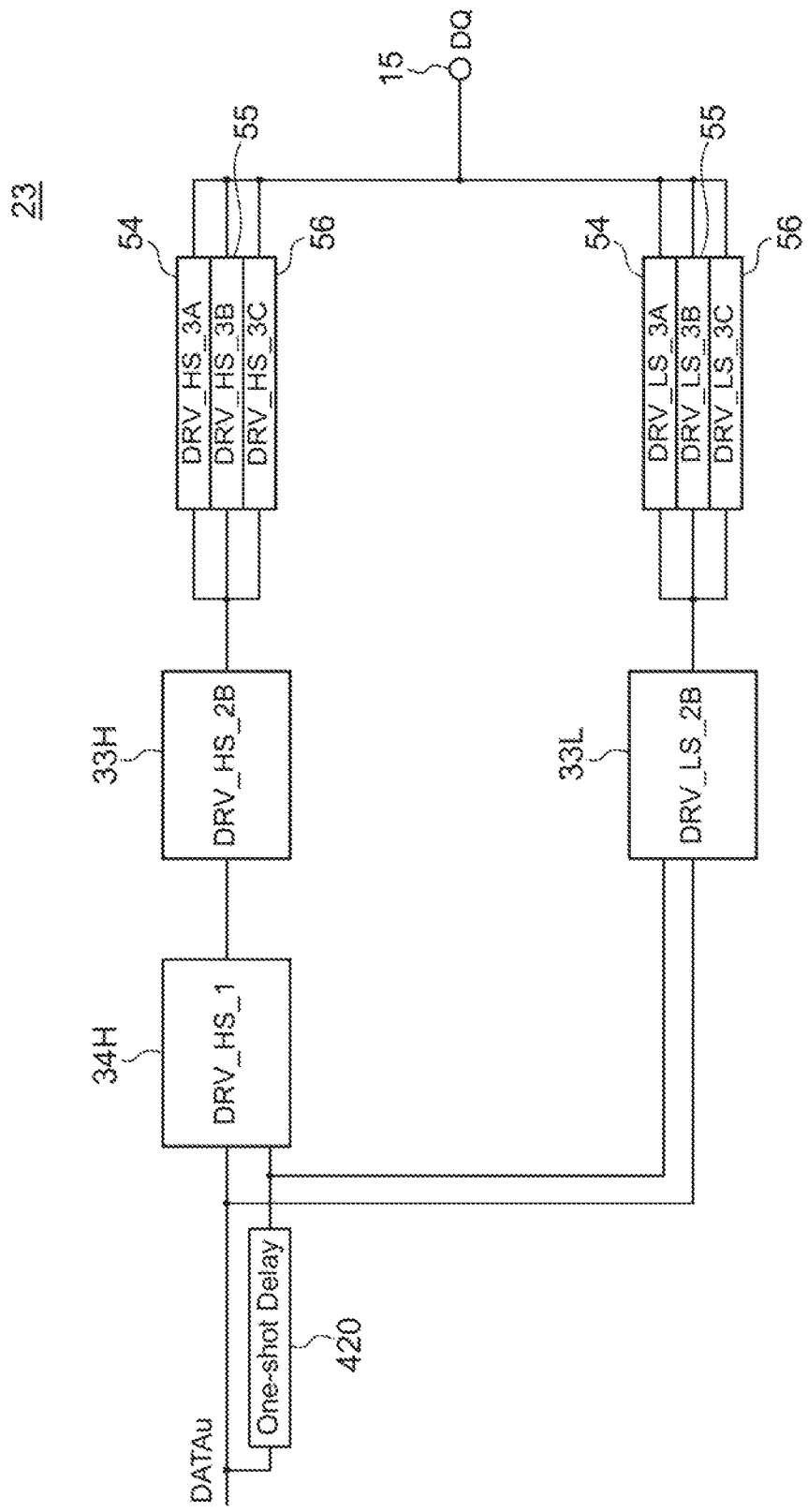
FIG. 2D is a block diagram showing a configuration of a pull-up pre-emphasis circuit.

The pre-emphasis circuit 23 is activated when the read data DQ changes to a high level, thereby making a rising edge of the read data DQ steep. As shown in FIG. 2D, the pre-emphasis circuit 23 includes a one-shot-pulse generation circuit 420, pull-up driver circuits 33H and 34H that belong to a high-speed path, and a pull-up driver circuit 33L that belongs to a low-speed path. Each of the pull-up driver circuits 33H and 33L includes three driver circuits 54 to 56 that are selected by a pre-emphasis operation start signal /PEmpStr.

Figure 2E:
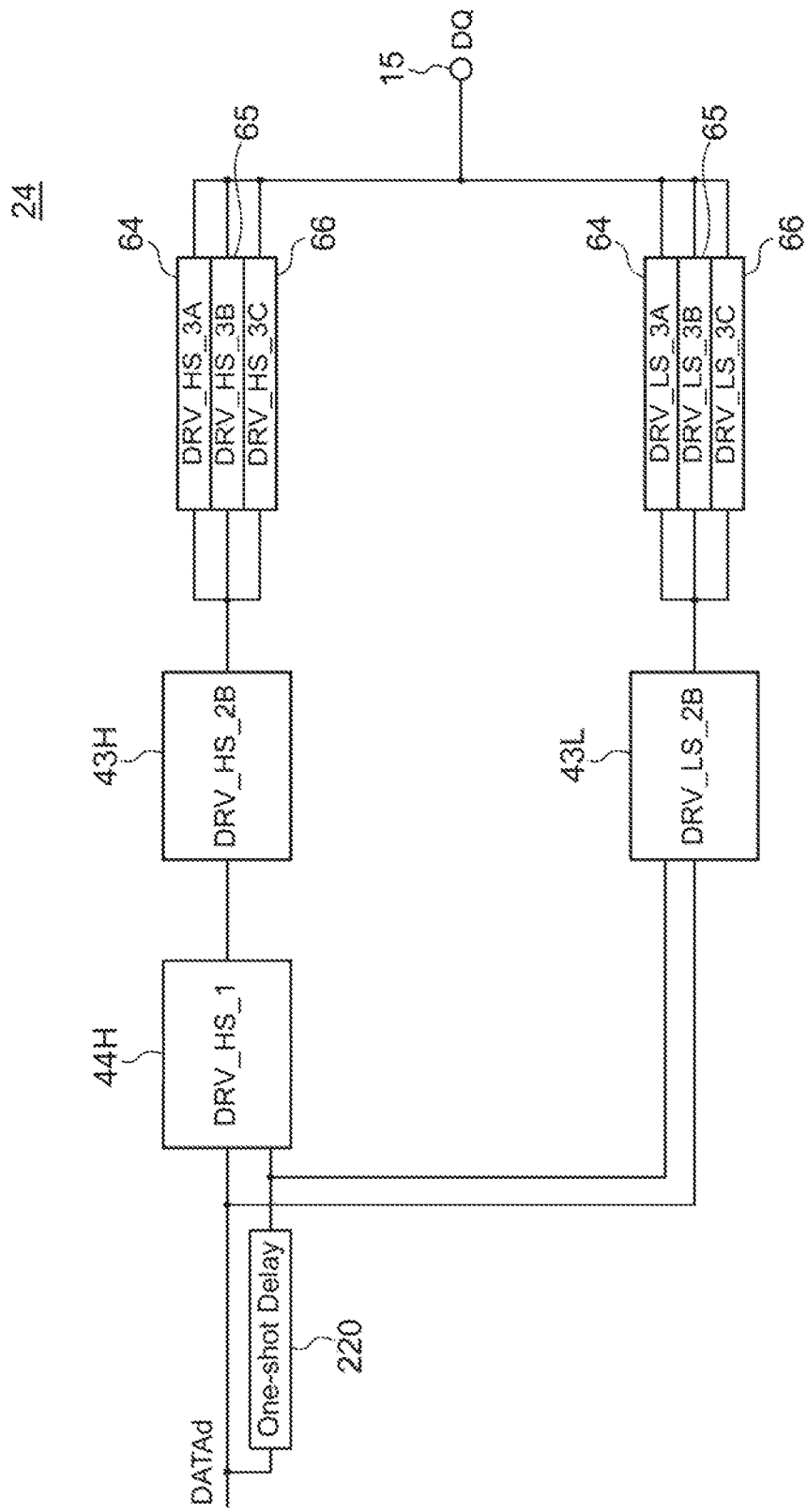
FIG. 2E is a block diagram showing a configuration of a pull-down pre-emphasis circuit.

The pre-emphasis circuit 24 is activated when the read data DQ changes to a low level, thereby making a falling edge of the read data DQ steep. As shown in FIG. 2E, the pre-emphasis circuit 24 includes a one-shot-pulse generation circuit 220, pull-dawn driver circuits 43H and 44H that belong to a high-speed path, and a pull-down driver circuit 43L that belongs to a low-speed path. Each of the pull-down driver circuits 43H and 43L includes three driver circuits 64 to (66 that are selected by the pre-emphasis operation start signal /PEmpStr.

Figure 3:
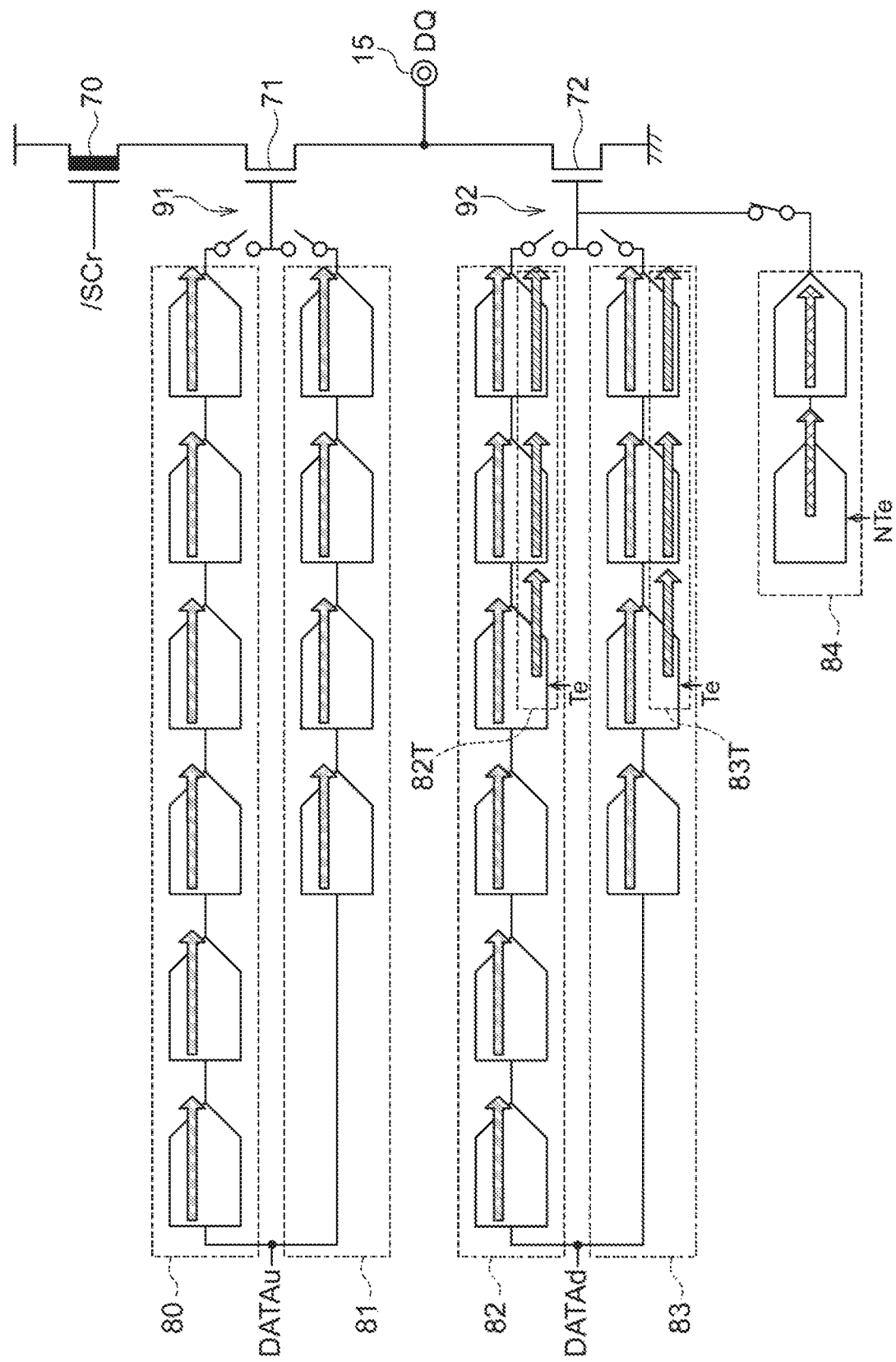
FIG. 3 is a schematic diagram for explaining flows of pull-up data and pull-down data.

FIG. 3 is a schematic diagram for explaining flows of the pull-up data DATAu and the pull-down data DATAd. As shown in FIG. 3, the pull-up data DATAu is supplied to a gate electrode of an output transistor 71 via a high-speed path 80 or a low-speed path 81. The high-speed path 80 is smaller than the low-speed path 81 in fan out. The output transistor 71 is an N-channel MOS transistor. Whether to use the high-speed path 80 or the low-speed path 81 is selected based on a speed mode signal. Outputs of the high-speed path 80 and the low-speed path 81 are supplied to the gate electrode of the output transistor 71 via a multiplexer 91. The pull-down data DATAd is supplied to a gate electrode of an output transistor 72 via a high-speed path 82 or a low-speed path 83. The high-speed path 82 is smaller than the low-speed path 83 in fan out. The output transistor 72 is an N-channel MOS transistor whether to use the high-speed path 82 or the low-speed path 83 is selected based on the speed mode signal. Outputs of the high-speed path 82, the low-speed path 83, and a non-target ODT path 84 are supplied to the gate electrode of the output transistor 72 via a multiplexer 92. As shown in FIG. 3, both the high-speed paths 80 and 82 include gate circuits arranged in six stages, whereas both the low-speed paths 81 and 83 include gate circuits arranged in four stages. The non-target ODT path 84 is selected when a non-target ODT enable signal NTe is activated. The non-target ODT enable signal NTe is kept active at a high level except for during a read operation and a write operation in which an output circuit is activated. While the non-target ODT enable signal NTe is active, all the other paths 80 to 83 are inactive.

In a case where the speed mode signal indicates a high-speed mode, the high-speed paths 80 and 82 are activated in a read operation and an ODT path 82T in the high-speed path 82 is activated in a target ODT operation. On the other hand, in a case where the speed mode signal indicates a low-speed mode, the low-speed paths 81 and 83 are activated in a read operation and an ODT path 83T in the low-speed path 83 is activated in a target ODT operation. The target ODT paths 82T and 83T are selected when a target ODT enable signal Te is activated. The target ODT enable signal Te is activated in a write operation. When the target ODT enable signal Te is activated, the pull-up side paths 80 and 81 and a portion of the pull-down side paths 82 and 83 other than the target ODT paths 82T and 83T are inactive.

A switching transistor 70, the output transistor 71, and the output transistor 72 are connected in series to one another between a high-potential side power line and a low-potential side power line. The switching transistor 70 is an N-channel MOS transistor in which a gate insulating film is formed to be thick, and a reset signal /SCr is supplied to a gate electrode thereof. The reset signal /SCr is an inverted signal of a reset signal /SCr that becomes low in a read operation. The data terminal 15 is connected to a connecting point between the output transistor 71 and the output transistor 72. In FIG. 3 and the subsequent drawings, a transistor in which a straight line opposed to its gate electrode is denoted with a bold line is a transistor in which its gate insulating film is formed to be thick.

Figure 4:
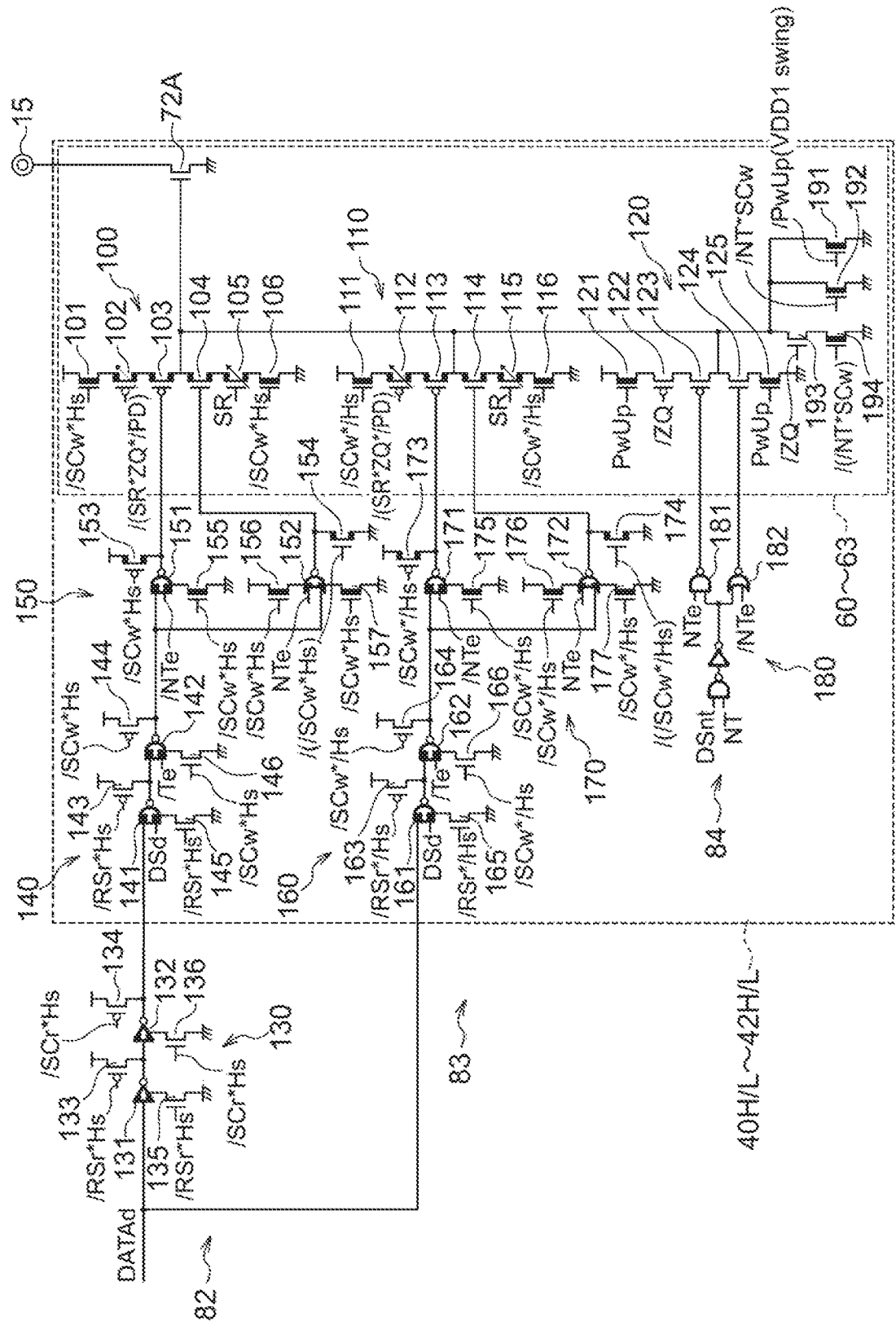
FIG. 4 is a circuit diagram showing a signal path in the pull-down circuit in more detail.

FIG. 4 is a circuit diagram showing a signal path in the pull-down circuit 22 in more detail. As described with reference to FIG. 2C, the pull-down circuit 22 includes the three pull-down driver circuits 40H to 42H and the three pull-down driver circuits 40L to 42L. Each of the pull-down driver circuits 40H to 42H and 40L to 42L includes the four output impedance calibration circuits 60 to 63. The pull-down driver circuits 40H/L to 42H/L have the same circuit configuration as one another, and the output impedance calibration circuits 60 to 63 have the same circuit configuration as one another. Therefore, portions having the same circuit configuration are collectively shown in FIG. 4.

The output impedance calibration circuits 60 to 63 each include three tristate buffer circuits 100, 110, and 120. Output nodes of the tristate buffer circuits 100, 110, and 120 are connected to a gate electrode of an output transistor 72A in common. That is, the output nodes of the tristate buffer circuits 100, 110, and 120 are connected in wired OR connection and configure the multiplexer 92 shown in FIG. 3. The output transistor 72A is one of the output transistors 72 shown in FIG. 3, which is included in the pull-down driver circuits 40H/L to 42H/L. A leak current in the output transistor 72A is increased to an appropriate level, so that the output transistor 72A has improved driving capability.

Figure 5A:
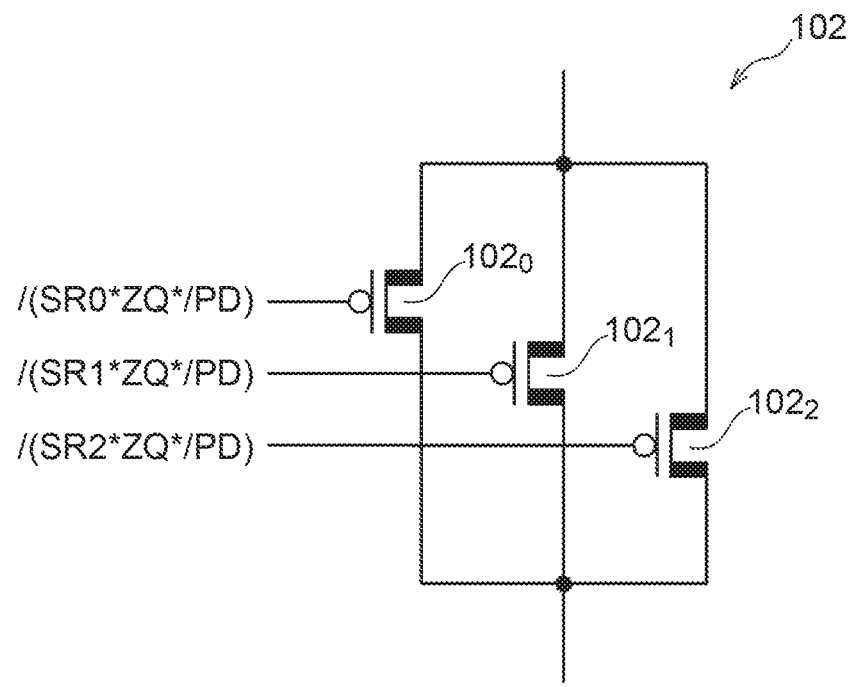
FIGS. 5A and 5B are circuit diagrams of an adjustment circuit.
Figure 5B:
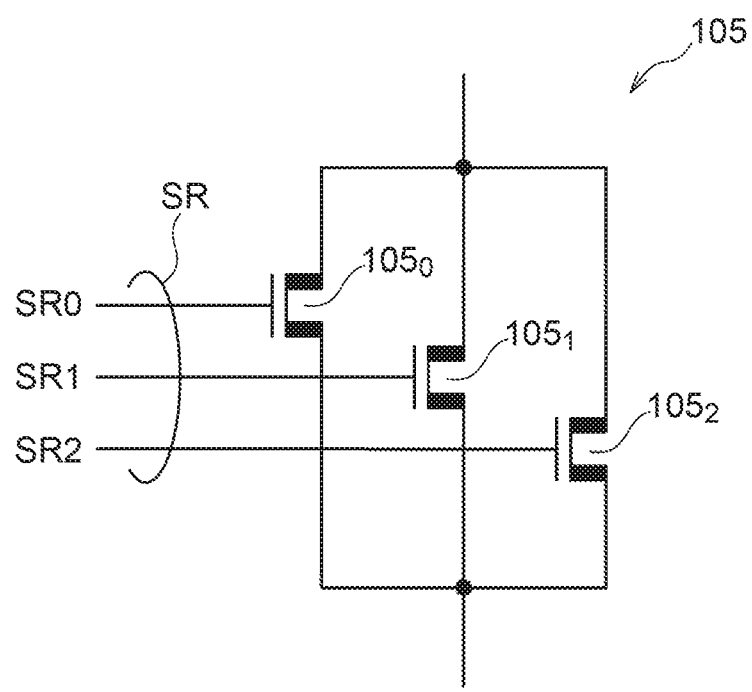

The tristate buffer circuit 100 belongs to the high-speed path 82 and includes transistors 101 to 106 that are connected in series to one another between a high-potential side power line and a low-potential side power line. The transistors 101 and 106 are N-channel MOS transistors, each of which has a gate insulating film formed to be thick, and a control signal /SCw*Hs is supplied to gate electrodes thereof. The control signal /SCw*Hs is an AND signal of an invested signal of a reset signal SCw that becomes low during a read operation and a write operation and the speed mode signal Hs, and uses a boosted potential VCCP. The speed mode signal Hs becomes high in a high-speed mode and becomes low in a low-speed mode. The transistor 102 configures an adjustment circuit that is activated while a corresponding one of the output impedance calibration circuits 60 to 63 is selected. As shown in FIG. 5A, the transistor 102 is configured by three P-channel MOS transistors $102_0$ to $102_2$ connected in parallel to one another. Control signals /(SR0*ZQ*/PD) to /(SR2*ZQ*/PD) are supplied to gate electrodes of the transistors $102_0$ to $102_2$, respectively. Control signals SR0 to SR2 are bit signals that configure the slew-rate selection signal SR. The control signal ZQ is a signal for selecting whether a corresponding one of the output impedance calibration circuits 60 to 63 is active or inactive. A control signal /PD is an inverted signal of a power-down signal PD that becomes high when power is down. The transistor 105 also configures an adjustment circuit. As shown in FIG. 5B, the transistor 105 is configured by three N-channel MOS transistors $105_0$ to $105_2$ connected in parallel to one another. The bit signals SR0 to SR2 that configure the slew-rate selection signal SR are supplied to gate electrodes of the transistors $105_0$ to $105_2$, respectively. The transistor 103 is a P-channel MOS transistor that receives an output of a NAND gate circuit 151 included in a logic circuit 150 in a preceding stage. The transistor 104 is an N-channel MOS transistor that receives an output of a NOR gate circuit 152 included in the logic circuit 150 in the preceding stage. The transistors 102 to 105 respectively have a lowered threshold voltage, and therefore can perform high-speed switching. In FIG. 4 and the subsequent drawings, a transistor of which both ends are denoted with a bold line is a transistor having a lowered threshold voltage. Further, among an inverter circuit, a NAND gate circuit, and a NOR gate circuit, a circuit having an input node denoted with a bold line is a circuit that uses a transistor having a lowered threshold voltage.

The pull-down data DATAd is input to the tristate buffer circuit 100 via the logic circuits 130 and 150 and a logic circuit 140 that are included in the high-speed path 82. The logic circuit 130 includes inverter circuits 131 and 132 connected to each other in cascade connection, transistors 133 and 134 that reset the high-speed path 82, and transistors 135 and 136 that activate the inverter circuits 131 and 132. A control signal /RSr*Hs is supplied to gate electrodes of the transistors 133 and 135. A control signal /SCr*Hs is supplied to gate electrodes of the transistors 134 and 136. A reset signal /RSr is an inverted signal of a reset signal RSr that becomes low during a read operation. The logic circuit 140 includes NAND gate circuits 141 and 142 connected to each other in cascade connection, transistors 143 and 144 that reset the high-speed path 82, and transistors 145 and 146 that activate the NAND gate circuits 141 and 142. An output signal of the logic circuit 130 and a driver-strength selection signal DSd are input to the NAND gate circuit 141. The driver-strength selection signal DSd is a signal for selecting whether a corresponding one of the pull-down driver circuits 40H/L to 42H/L is active or inactive. An output signal of the NAND gate circuit 141 and an inverted signal of the target ODT enable signal Te are input to the NAND gate circuit 142. The control signal RSr*Hs is supplied to gate electrodes of the transistors 143 and 145. The control signal /SCw*Hs is supplied to gate electrodes of the transistors 144 and 146. The logic circuit 150 includes the NAND gate circuit 151, a NOR gate circuit 152, a transistor 153 that fixes a gate electrode of the transistor 103 at a high level, a transistor 154 that fixes a gate electrode of the transistor 104 at a low level, a transistor 155 that activates the NAND gate circuit 151, and transistors 156 and 157 that activate the NOR gate circuit 152. An output signal of the logic circuit 140 and an inverted signal of the non-target ODT enable signal NTe are input to the NAND gate circuit 151. The output signal of the logic circuit 140 and the non-target ODT enable signal NTe are input to the NOR gate circuit 152. The control signal /SCw*Hs is supplied to gate electrodes of the transistors 153 and 155 to 157. An inverted signal /(/SCw*Hs) of the control signal /SCw*Hs is supplied to a gate electrode of the transistor 154. Because N-channel MOS transistors each including a gate insulating film formed to be thick are used as the transistors 155 to 157, the influence of process variation, particularly on the transistor 156, can be reduced as compared with a case of using a standard P-channel MOS transistor that has low ability of supplying a current, and the occupied area can be also reduced. Only a power potential VDD2 lower than the boosted potential VCCP is used for the control signal /SCr*Hs and /SCw*Hs used in the logic circuits 130 and 140, whereas the boosted potential VCCP is used for the control signal /SCw*Hs used in the logic circuit 150 and subsequent circuits for driving a thick film transistor. With this configuration, in a case where the speed mode signal Hs indicates a high-speed mode, either one of the transistors 103 and 104 is turned on based on the pull-down data DATAd in a read operation, and the transistor 103 is turned on in a target ODT operation. Therefore, the output node of the tristate buffer circuit 100 is driven to a high level or a low level. On the other hand, in a case where the speed mode signal Hs indicates a low-speed mode or during a non-target ODT operation, the output node of the tristate buffer circuit 100 is placed in a high-impedance state. The high-impedance state of the tristate buffer circuit 100 is realized by tuning-off of the transistors 103 and 104 for access or turning-off of the transistors 101 and 106 for switching. When the transistors 103 and 104 for access are turned off, a parasitic capacitance of the output node of the tristate buffer circuit 100 is reduced. When the transistors 106 and 101 for switching are turned off, a sub-threshold leak in an inactive state is reduced. Further, because N-channel MOS transistors each including a gate insulating film formed to be thick are used as the transistors 101 and 106 for switching, the influence of process variation, particularly on the transistor 101, can be reduced as compared with a case of using a standard P-channel MOS transistor that has low ability of supplying a current, the occupied area can be also reduced, and injection of charges can be prevented when ESD occurs.

The tristate buffer circuit 110 belongs to the low-speed path 83 and includes transistors 111 to 116 that are connected in series to one another between a high-potential side power line and a low-potential side power line. The tristate buffer circuit 110 have the same circuit configuration as the tristate buffer circuit 100. The same signals as those input to the gate electrodes of the transistors 101, 102, 105, and 106 are input to gate electrodes of the transistors 111, 112, 115, and 116, except that the speed mode signal HS is inverted.

The pull-down data DATAd is input to the tristate buffer circuit 110 via logic circuits 160 and 170 included in the low-speed path 83. The logic circuit 160 includes NAND gate circuits 161 and 162 connected to each other in cascade connection, transistors 163 and 164 that reset the low-speed path 83, and transistors 165 and 166 that activate the NAND gate circuits 161 and 162. The pull-down data DATAd and the driver-strength selection signal DSd are input to the NAND gate circuit 161. An output signal of the NAND gate circuit 161 and an inverted signal of the target ODT enable signal Te are input to the NAND gate circuit 162. A control signal /RSr*Hs is supplied to gate electrodes of the transistors 163 and 165. A control signal /SCw*/Hs is supplied to gate electrodes of the transistors 164 and 166. The logic circuit 170 includes a NAND gate circuit 171, a NOR gate circuit 172, a transistor 173 that fixes a gate electrode of the transistor 113 at a high level, a transistor 174 that fixes a gate electrode of the transistor 114 at a low level, a transistor 175 that activates the NAND gate circuit 171, and transistors 176 and 177 that activate the NOR gate circuit 172. An output signal of the logic circuit 160 and the inverted signal of the non-target ODT enable signal NTe are input to the NAND gate circuit 171. The output signal of the logic circuit 160 and the non-target ODT enable signal NTe are input to the NOR gate circuit 172. The control signal /SCw*/Hs is supplied to gate electrodes of the transistors 173 and 175 to 177. An inverted signal of the control signal /SCw*/Hs is supplied to a gate electrode of the transistor 174. Only the power potential VDD2 lower than the boosted potential VCCP is used for the control signal /SCw*/Hs used in the logic circuit 160, whereas the boosted potential VCCP is used for the control signal /SCw*/Hs used in the logic circuit 170 and subsequent circuits for driving a thick film transistor. With this configuration, in a case where the speed mode signal Hs indicates a low-speed mode, either one of the transistors 113 and 114 is turned on based on the pull-down data DATAd during a read operation, and the transistor 113 is turned on during a target ODT operation. Therefore, the output node of the tristate buffer circuit 110 is driven to a high level or a low level. On the other hand, in a case where the speed mode signal Hs indicates a high-speed mode or during a non-target ODT operation, the output node of the tristate buffer circuit 110 is placed in a high-impedance state.

The tristate buffer circuit 120 belongs to the non-target ODT path 84 and includes transistors 121 to 125 that are connected in series to one another between a high-potential side power line and a low-potential side power line. The transistors 121 and 125 are N-channel MOS transistors, each of which has a gate insulating film formed to be thick, and a control signal PwUp is supplied to gate electrodes thereof. The control signal PwUp holds a low level in a transition period of a power-up operation after power is on, and becomes high when the power-up operation is completed. The transistor 122 is a P-channel MOS transistor that has a normal threshold voltage, and a control signal /ZQ is supplied to a gate electrode thereof. The transistor 123 is a P-channel MOS transistor that receives an output of a NAND gate circuit 181 included in a logic circuit 180 in a preceding stage. The transistor 124 is an N-channel MOS transistor that receives an output of a NOR gate circuit 182 included in the logic circuit 180 in the preceding stage. Both the transistors 123 and 124 respectively have a normal threshold. The non-target ODT path 84 is activated in many periods including a power-down period, except for a period during which the high-speed path 82 or the low-speed path 83 is active. Therefore, a sub-threshold current is reduced by using the transistors 123 and 124 that respectively have a normal threshold voltage. Further, because N-channel MOS transistors each including a gate insulating film formed to be thick are used as the transistors 121 and 125, injection of charges can be prevented when ESD occurs.

The non-target ODT enable signal NTe and an AND signal of the driver-strength selection signal DSnt and a non-target ODT mode signal NT are supplied to the NAND gate circuit 181. An inverted signal of the non-target ODT enable signal NTe and the AND signal of the driver-strength selection signal DSnt and the non-target ODT mode signal NT are supplied to the NOR gate circuit 182. The driver-strength selection signal DSnt is a signal for selecting driver strength in a non-target ODT operation. The non-target ODT mode signal NT is a mode signal that selects whether to perform a non-target ODT operation. With this configuration, in a case where a non-target ODT operation is allowed, the transistor 123 is turned on when the non-target ODT enable signal NTe is activated. Therefore, the output node of the tristate buffer circuit 120 is driven to a high level. However because the transistors 122 to 124 respectively have a normal threshold voltage, a leak current during a non-target ODT operation is reduced. On the other hand, in a case where a non-target ODT operation is not allowed or the non-target ODT enable signal NTe is not activated, the output node of the tristate buffer circuit 120 is placed in a high-impedance state.

Further, the output impedance calibration circuits 60 to 63 each include N-channel MOS transistors 191 to 194 that reset the gate electrode of the output transistor 72A to a low level. Control signals /PwUp and /NT*SCw, the control signal /ZQ, and a control signal /(/NT*SCw) are supplied to gate electrodes of the transistors 191 to 194, respectively. The transistors 191, 192, and 194 are N-channel MOS transistors, each of which has a gate insulating film formed to be thick. Because N-channel MOS transistors each including a gate insulating film formed to be thick are used as the transistors 191, 192, and 194, injection of charges can be prevented when ESD occurs. Further, the amplitude of the control signal /PwUp input to the transistor 191 is not the boosted potential VCCP but an external power potential VDD1. Therefore, immediately after power is on, the gate electrode of the output transistor 72A is surely fixed at a low level. On the other hand, the amplitudes of the control signals /NT*SCw and /(NT*SCw) are VCCP, and the amplitude of the control signal /ZQ is VDD2. The transistor 192 is turned on while a current mode is not a non-target ODT mode and the reset signal SCw is active. A reset circuit configured by the transistors 193 and 194 is turned on in a non-target ODT mode or while the reset signal SCw is inactive and a corresponding one of the output impedance calibration circuits 60 to 63 is not selected.

Figure 6:
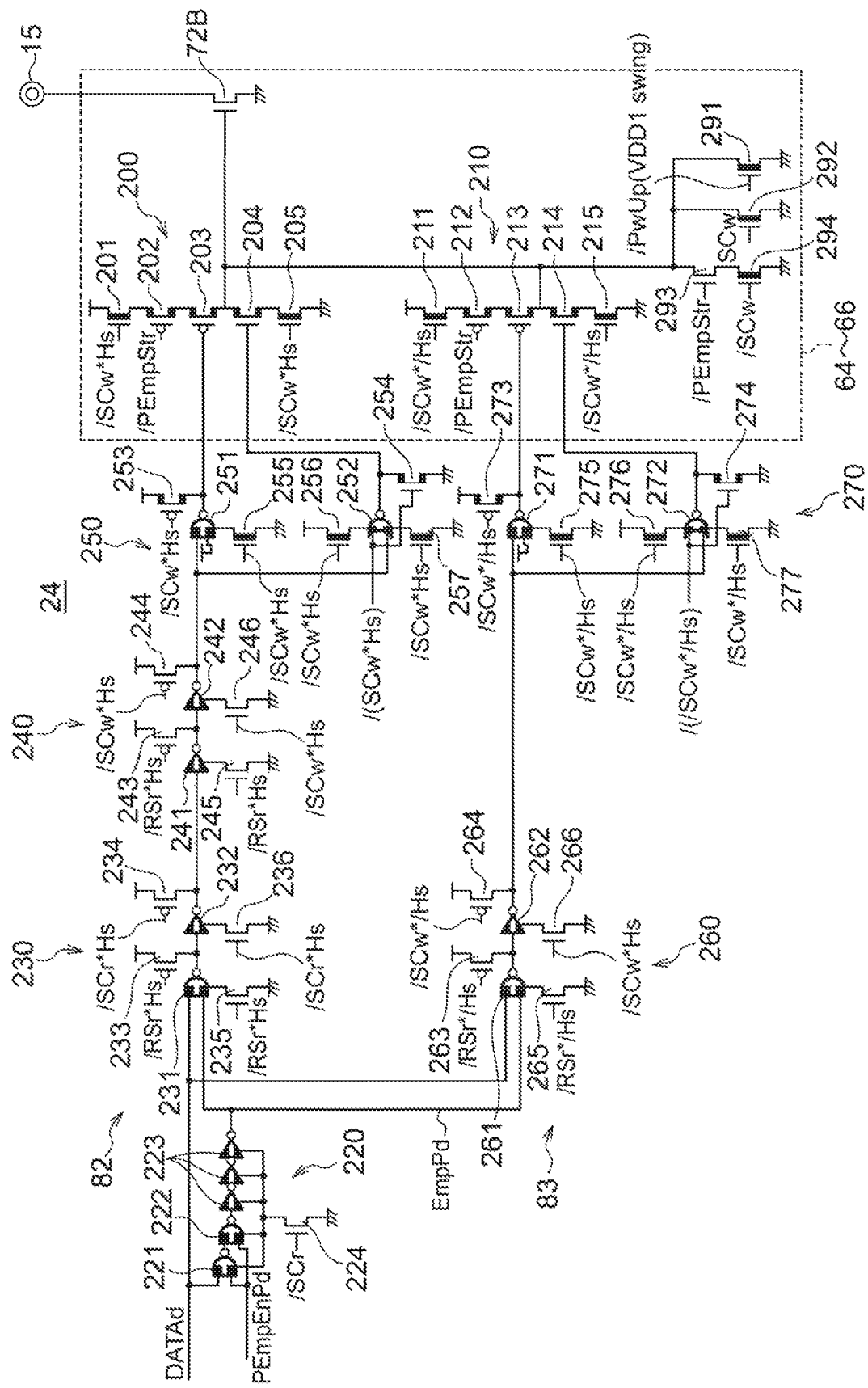
FIG. 6 is a circuit diagram of a pre-emphasis circuit on a pull-down side.

FIG. 6 is a circuit diagram of the pre-emphasis circuit 24. The pre-emphasis circuit 24 includes two tristate buffer circuits 200 and 210. Output nodes of the tristate buffer circuits 200 and 210 are connected to a gate electrode of an output transistor 72B in common. That is, the output nodes of the tristate buffer circuits 200 and 210 are connected in wired OR connection and configure the multiplexer 92 shown in FIG. 3. The output transistor 72B is one of the output transistors 72 shown in FIG. 3, which is included in the pre-emphasis circuit 24.

The tristate buffer circuit 200 belongs to the high-speed path 82 and includes transistors 201 to 205 that are connected in series to one another between a high-potential side power line and a low-potential side power line. The transistors 201 and 205 are N-channel MOS transistors, each of which has a gate insulating film formed to be thick, and the control signal /SCw*Hs is supplied to gate electrodes thereof. A pre-emphasis operation start signal /PEmpStr is input to a gate electrode of the transistor 202. The transistor 203 is a P-channel MOS transistor that receives an output of a NAND gate circuit 251 included in a logic circuit 250 in a preceding stage. The transistor 204 is an N-channel MOS transistor that receives an output of a NOR gate circuit 252 included in the logic circuit 250 in the preceding stage. The transistors 202 to 204 respectively have a lowered threshold, and therefore can perform high-speed switching.

The pull-down data DATAd is supplied to a one-shot-pulse generation circuit 220. The one-shot-pulse generation circuit 220 includes a NAND gate circuit 221 that receives the pull-down data DATAd and a pull-down preemphasis enable signal PEmpEnPd, a NAND gate circuit 222 that receives an output signal of the NAND gate circuit 221 and the pull-down pre-emphasis enable signal PEmpEnPd, inverter circuits 223 that are connected in cascade connection as a subsequent stage of the NAND gate circuit 222, where the number of the inverter circuits 223 being an odd number, and an N-channel MOS transistor 224 that supplies power to the NAND gate circuits 221 and 222 and the inverter circuits 223. The reset signal /SCr is supplied to a gate electrode of the transistor 224. The pull-down pre-emphasis enable signal PEmpEnPd selects whether to perform a pre-emphasis operation at falling of the read data DQ. Therefore, in a case where the pull-down pre-emphasis enable signal PEmpEnPd is active at a high level, a one-shot signal EmpPd is generated firm the one-shot-pulse generation circuit 220 in synchronization with a rising edge of the pull-down data DATAd. The one-shot-pulse generation circuit 220 does not use a NOR gate circuit that requires a plurality of P-channel MOS transistors connected in series, but is configured by using a NAND gate circuit that does not require a plurality of P-channel MOS transistors connected in series, and thus it is suitable for a high-speed operation.

The one-shot signal EmpPd and the pull-down data DATAd are input to the tristate buffer circuit 200 via logic circuits 230 and 240 and the logic circuit 250 included in the high-speed path 82. The logic circuit 230 includes a NAND gate circuit 231 that receives the one-shot signal EmpPd and the pull-down data DATAd, an inverter circuit 232, transistors 233 and 234 that reset the high-speed path 82, and transistors 235 and 236 that activate the NAND gate circuit 231 and the inverter circuit 232. The control signal /RSr*Hs is supplied to gate electrodes of the transistors 233 and 235. The control signal /SCr*Hs is supplied to gate electrodes of the transistors 234 and 236. The logic circuit 240 includes inverter circuits 241 and 242 connected to each other in cascade connection, transistors 243 and 244 that reset the high-speed path 82, and transistors 245 and 246 that activate the inverter circuits 241 and 242. The control signal /RSr*Hs is supplied to gate electrodes of the transistors 243 and 245. The control signal /SCw*Hs is supplied to gate electrodes of the transistors 244 and 246. The logic circuit 250 includes the NAND gate circuit 251, the NOR gate circuit 252, a transistor 253 that fixes a gate electrode of the transistor 203 at a high level, a transistor 254 that fixes a gate electrode of the transistor 204 at a low level, a transistor 255 that activates the NAND gate circuit 251, and transistors 256 and 257 that activate the NOR gate circuit 252. An output signal of the logic circuit 240 and a high-level fixed signal are input to the NAND gate circuit 251. The output signal of the logic circuit 240 and the control signal /(/SCw*Hs) are input to the NOR gate circuit 252. The control signal /SCw*Hs is supplied to gate electrodes of the transistors 253 and 255 to 257. The inverted signal /(SCw*Hs) of the control signal /SCw*Hs is supplied to a gate electrode of the transistor 254. With this configuration, in a case where the speed mode signal Hs indicates a high-speed mode, the transistor 203 is temporarily turned on when the pull-down data DATAd changes to a high-level in a read operation. Therefore, the output transistor 72B is temporarily turned on, so that a pre-emphasis operation in a pull-down state is performed. On the other hand, in a case where the speed mode signal Hs indicates a low-speed mode, the output node of the tristate buffer circuit 200 is placed in a high-impedance state.

The tristate buffer circuit 210 belongs to the low-speed path 83 and includes transistors 211 to 215 that are connected in series to one another between a high-potential side power line and a low-potential side power line. The tristate buffer circuit 210 have the same circuit configuration as the tristate buffer circuit 200. The same signals as those input to the gate electrodes of the transistors 201, 202, and 205 are input to gate electrodes of the transistors 211, 212 and 215, except that the speed mode signal HS is inverted.

The one-shot signal EmpPd and the pull-down data DATAd are input to the tristate buffer circuit 210 via logic circuits 260 and 270 included in the low-speed path 83. The logic circuit 260 includes a NAND gate circuit 261 that receives the one-shot signal EmpPd and the pull-down data DATAd, an inverter circuit 262, transistors 263 and 264 that reset the low-speed path 83, and transistors 265 and 266 that activate the NAND gate circuit 261 and the inverter circuit 262. The control signal /RSr*/Hs is supplied to gate electrodes of the transistors 263 and 265. The control signal /SCw*Hs is supplied to gate electrodes of the transistors 264 and 266. The logic circuit 270 includes a NAND gate circuit 271, a NOR gate circuit 272, a transistor 273 that fixes a gate electrode of the transistor 213 at a high level, a transistor 274 that fixes a gate electrode of the transistor 214 at a low level, a transistor 275 that activates the NAND gate circuit 271, and transistors 276 and 277 that activate the NOR gate circuit 272. An output signal of the logic circuit 260 and a high-level fixed signal are input to the NAND gate circuit 271. The output signal of the logic circuit 260 and a control signal /(/SCw*/Hs) are input to the NOR gate circuit 272. The control signal /SCw*/Hs is supplied to gate electrodes of the transistors 273 and 275 to 277. The inverted signal /(/SCw*Hs) of the control signal /SCw*/Hs is supplied to a gate electrode of the transistor 274. With this configuration, in a case where the speed mode signal Hs indicates a low-speed mode, the transistor 213 is temporarily turned on when the pull-down data DATAd changes to a high-level in a read operation. Therefore, the output transistor 72B is temporarily turned on, so that a pre-emphasis operation in a pull-down state is performed. On the other hand, in a case where the speed mode signal Hs indicates a high-speed mode, the output node of the tristate buffer circuit 210 is placed in a high-impedance state.

Further, the preemphasis circuit 24 includes N-channel MOS transistors 291 to 294 that reset the gate electrode of the output transistor 72B to a low level. The control signals /PwUp, SCw, and /PEmpStr and a control signal /SCw are supplied to gate electrodes of the transistors 291 to 294, respectively. The transistors 291, 292, and 294 are N-channel MOS transistors, each of which has a gate insulating film formed to be thick. Further, the amplitude of the control signal /PwUp input to the transistor 291 is not the boosted potential VCCP but the external power potential VDD1. Meanwhile, the amplitudes of the control signals SCw and /SCw are VCCP, and the amplitude of the control signal /PEmpStr is VDD2.

In the pre-emphasis circuit 24, the driver circuits 64 to 66 are provided in parallel.

Figure 7:
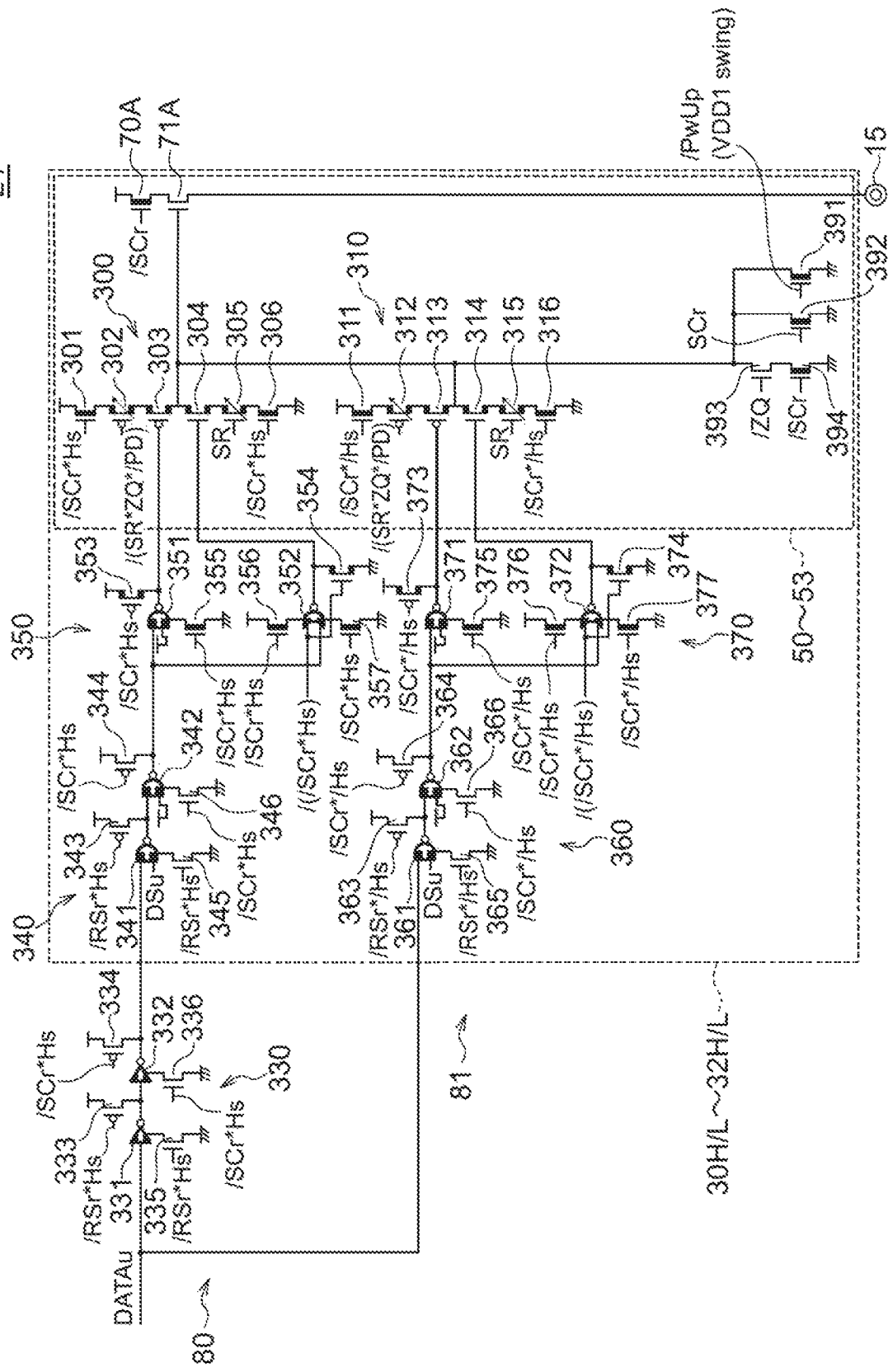
FIG. 7 is a circuit diagram showing a signal path in the pull-up circuit in more detail.

FIG. 7 is a circuit diagram showing a signal path in the pull-up circuit 21 in more detail. As described with reference to FIG. 28, the pull-up circuit 21 includes the three pull-up driver circuits 30H to 32H and the three pull-up driver circuits 30L to 32L. Each of the pull-up driver circuits 3014 to 32H and 30L to 32L includes the four output impedance calibration circuits 50 to 53. The pull-up driver circuits 30H/L to 32H/L have the same circuit configuration as one another, and the output impedance calibration circuits 50 to 53 have the same circuit configuration as one another. Therefore, portions having the same configuration are collectively shown in FIG. 7.

The output impedance calibration circuits 50 to 53 each include two tristate buffer circuits 300 and 310. Output nodes of the tristate buffer circuits 300 and 310 are connected to a gate electrode of an output transistor 71A in common. That is, the output nodes of the tristate buffer circuits 300 and 310 are connected in wired OR connection and configure a multiplexer 91 shown in FIG. 3. The output transistor 71A is one of the output transistors 71 shown in FIG. 3, which is included in the pull-up driver circuits 30H/L to 32H/L. In the output transistor 71A, the amount of ion implantation is adjusted to improve the linearity and operating-voltage margin, so that a threshold voltage is lowered.

The tristate buffer circuit 300 belongs to a high-speed path 80 and includes transistors 301 to 306 that are connected in series to one another between a high-potential side power line and a low-potential side power line. The transistors 301 and 306 are N-channel MOS transistors, each of which has a gate insulating film formed to be thick, and the control signal /SCr*Hs is supplied to gate electrodes thereof. A level of the control signal /SCr*Hs input to the transistors 301 and 306 is the boosted potential VCCP. The transistors 302 and 305 correspond to the transistors 102 and 105 shown in FIG. 4, and the same signals as the control signals input to the transistors 102 and 105 are input to the transistors 302 and 305. The transistor 303 is a P-channel MOS transistor that receives an output of a NAND gate circuit 351 included in a logic circuit 350 in a preceding stage. The transistor 304 is an N-channel MOS transistor that receives an output of a NOR gate circuit 352 included in the logic circuit 350 in the preceding stage. The transistors 302 to 305 respectively have a lowered threshold voltage, and therefore can perform high-speed switching.

The pull-up data DATAu is input to the tristate buffer circuit 300 via logic circuits 330 and 340 and the logic circuit 350 that are included in the high-speed path 80. The logic circuit 330 includes inverter circuits 331 and 332 connected to each other in cascade connection, transistors 333 and 334 that reset the high-speed path 80, and transistors 335 and 336 that activate the inverter circuits 331 and 332. The control signal /RSr*Hs is supplied to gate electrodes of the transistors 333 and 335. The control signal /SCr*Hs is supplied to gate electrodes of the transistors 334 and 336. The logic circuit 340 includes NAND gate circuits 341 and 342 connected to each other in cascade connection, transistors 343 and 344 that reset the high-speed path 80, and transistors 345 and 346 that activate the NAND gate circuits 341 and 342. An output signal of the logic circuit 330 and a driver-strength selection signal DSu are input to the NAND gate circuit 341. The driver-strength selection signal DSu is a signal for selecting whether a corresponding one of the pull-up driver circuits 30H/L to 32H/L is active or inactive. An output signal of the NAND gate circuit 341 and a high-level fixed signal are input to the NAND gate circuit 342. The control signal /RSr*Hs is supplied to gate electrodes of the transistors 343 and 345. The control signal /SCr*Hs is supplied to gate electrodes of the transistors 344 and 346. The logic circuit 350 includes the NAND gate circuit 351, the NOR gate circuit 352, a transistor 353 that fixes a gate electrode of the transistor 303 at a high level, a transistor 354 that fixes a gate electrode of the transistor 304 at a low level, a transistor 355 that activates the NAND gate circuit 351, and transistors 356 and 357 that activate the NOR gate circuit 352. An output signal of the logic circuit 340 and a high-level fixed signal are input to the NAND gate circuit 351. The output signal of the logic circuit 340 and a control signal /(/SCr*Hs) are input to the NOR gate circuit 352. The control signal /SC*Hs is supplied to gate electrodes of the transistors 353 and 355 to 357. The inverted signal /(/SCr*Hs) of the control signal /SCr*Hs is supplied to a gate electrode of the transistor 354. The power potential VDD2 lower than the boosted potential VCCP is used for the control signal /SCr*Hs used in the logic circuits 330 and 340, whereas the boosted potential VCCP is used for the control signal /SCr*Hs used in the logic circuit 350 and subsequent circuits for driving a thick film transistor. With this configuration, in a case where the speed mode signal Hs indicates a high-speed mode, either one of the transistors 303 and 304 is turned on based on the pull-up data DATAu in a read operation. Therefore, the output node of the tristate buffer circuit 300 is driven to a high level or a low level. On the other hand, in a case where the speed mode signal Hs indicates a low-speed mode, the output node of the tristate buffer circuit 300 is placed in a high-impedance state.

The tristate buffer circuit 310 belongs to the low-speed path 81 and includes transistors 311 to 316 that are connected in series to one another between a high-potential side power line and a low-potential side power line. The tristate buffer circuit 310 have the same circuit configuration as the tristate buffer circuit 300. The sane signals as those input to the gate electrodes of the transistors 301, 302, 305, and 306 are input to gate electrodes of the transistors 311, 312, 315, and 316, except that the speed mode signal Hs is inverted.

The pull-up data DATAu is input to the tristate buffer circuit 310 via logic circuits 360 and 370 included in the low-speed path 81. The logic circuit 360 includes NAND gate circuits 361 and 362 connected to each other in cascade connection, transistors 363 and 364 that reset the low-speed path 81, and transistors 365 and 366 that activate the NAND gate circuits 361 and 362. The pull-up data DATAu and the driver-strength selection signal DSu are input to the NAND gate circuit 361. An output signal of the NAND gate circuit 361 and a high-level fixed signal are input to the NAND gate circuit 362. The control signal /RSr*/Hs is supplied to gate electrodes of the transistors 363 and 365. A control signal /SCr*/Hs is supplied to gate electrodes of the transistors 364 and 366. The logic circuit 370 includes a NAND gate circuit 371, a NOR gate circuit 372, a transistor 373 that fixes a gate electrode of the transistor 313 at a high level, a transistor 374 that fixes a gate electrode of the transistor 314 at a low level, a transistor 375 that activates the NAND gate circuit 371, and transistors 376 and 377 that activate the NOR gate circuit 372. An output signal of the logic circuit 360 and a high-level fixed signal are input to the NAND gate circuit 371. The output signal of the logic circuit 360 and the control signal /(/SCr*/Hs) are input to the NOR gate circuit 372. The control signal /SCr*/Hs is supplied to gate electrodes of the transistors 373 and 375 to 377. The inverted signal of the control signal /SCr*/Hs is supplied to a gate electrode of the transistor 374. The power potential VDD2 lower than the boosted potential VCCP is used for the control signal /SCr*/Hs used in the logic circuit 360, whereas the boosted potential VCCP is used for the control signal /SCr*/Hs used in the logic circuit 370 and subsequent circuits for driving a thick film transistor. With this configuration, in a case where the speed mode signal Hs indicates a low-speed mode, either one of the transistors 313 and 314 is turned on based on the pull-up data DATAu in a read operation. Therefore, the output node of the tristate buffer circuit 310 is driven to a high level or a low level. On the other hand, in a case where the speed mode signal Hs indicates a high-speed mode, the output node of the tristate buffer circuit 310 is placed in a high-impedance state.

Further, the output impedance calibration circuits 50 to 53 each include N-channel MOS transistors 391 to 394 that reset the gate electrode of the output transistor 71A to a low level. The control signals /PwUp, Scr, /ZQ, and /SCr are supplied to gate electrodes of the transistors 391 to 394, respectively. The transistors 391, 392, and 394 are N-channel MOS transistors, each of which has a gate insulating film formed to be thick. Further, the amplitude of the control signal /PwUp input to the transistor 391 is not the boosted potential VCCP but the external power potential VDD1. Meanwhile, the amplitudes of the control signals Scr and /SCr are VCCP, and the amplitude of the control signal /ZQ is VDD2.

Figure 8:
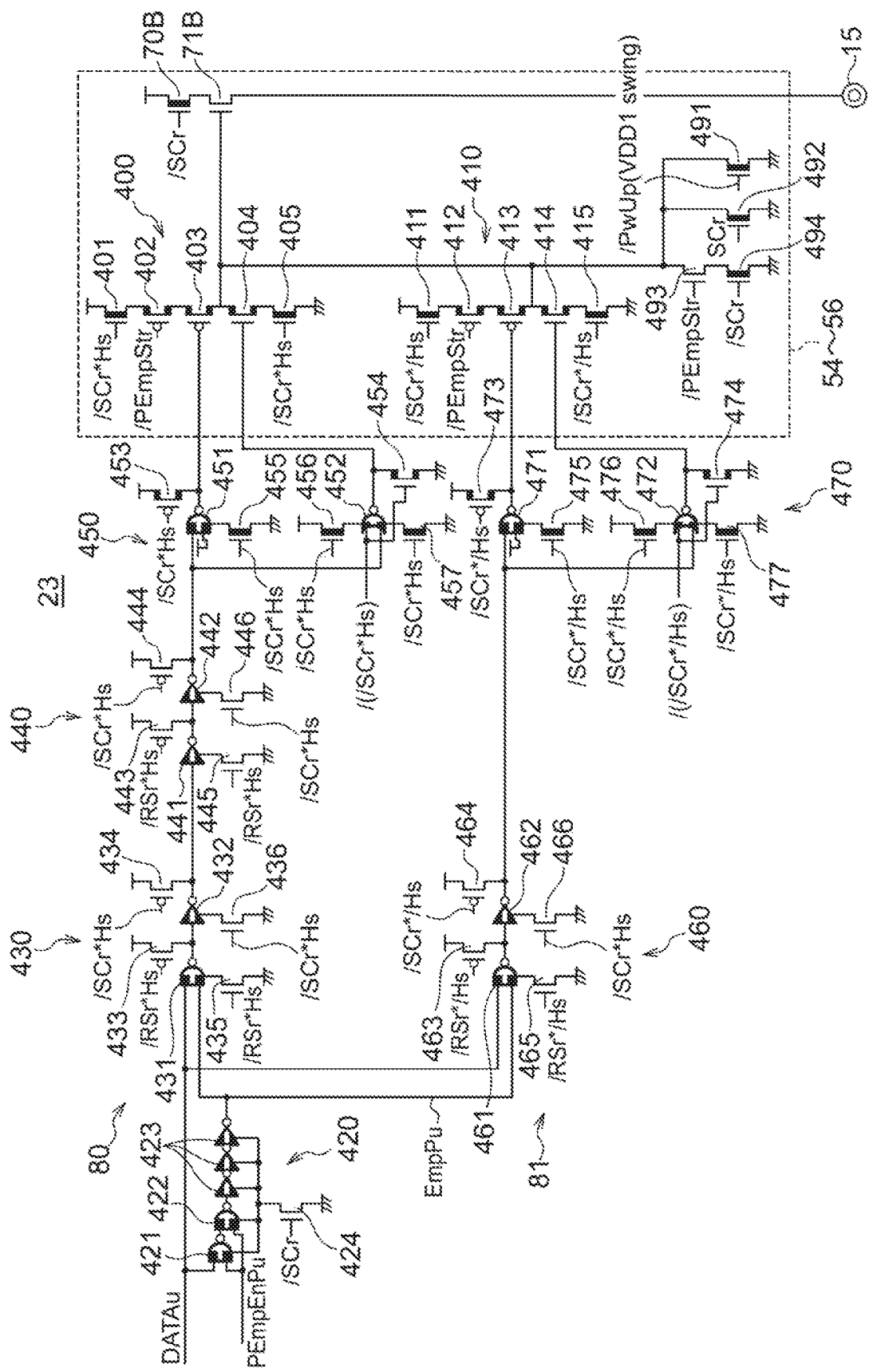
FIG. 8 is a circuit diagram of a pre-emphasis circuit on a pull-up side.

FIG. 8 is a circuit diagram of the pre-emphasis circuit 23. The pre-emphasis circuit 23 includes two tristate buffer circuits 400 and 410. Output nodes of the tristate buffer circuits 400 and 410 are connected to a gate electrode of an output transistor 71B in common. That is, the output nodes of the tristate buffer circuits 400 and 410 are connected in wired OR connection and configure the multiplexer 91 shown in FIG. 3. The output transistor 71B is one of the output transistors 71 shown in FIG. 3, which is included in the pre-emphasis circuit 23.

The tristate buffer circuit 400 belongs to the high-speed path 80 and includes transistors 401 to 405 that are connected in series to one another between a high-potential side power line and a low-potential side power line. The transistors 401 and 405 are N-channel MOS transistors, each of which has a gate insulating film formed to be thick, and the control signal /SCr*Hs is supplied to gate electrodes thereof. The pre-emphasis operation start signal /PEmpStr is input to a gate electrode of the transistor 402. The transistor 403 is a P-channel MOS transistor that receives an output of a NAND gate circuit 451 included in a logic circuit 450 in a preceding stage. The transistor 404 is an N-channel MOS transistor that receives an output of a NOR gate circuit 452 included in the logic circuit 450 in the preceding stage. The transistors 402 to 404 respectively have a lowered threshold voltage, and therefore can perform high-speed switching.

The pull-up data DATAu is supplied to the one-shot-pulse generation circuit 420. The one-shot-pulse generation circuit 420 includes a NAND gate circuit 421 that receives the pull-up data DATAu and a pull-up pre-emphasis enable signal PEmpEnPu, a NAND gate circuit 422 that receives an output signal of the NAND gate circuit 421 and the pull-up pre-emphasis enable signal PEmpEnPu, inverter circuits 423 that are connected in cascade connection as a subsequent stage of the NAND gate circuit 422, where the number of the inverter circuits 423 being an odd number, and an N-channel MOS transistor 424 that supplies power to the NAND gate circuits 421 and 422 and the inverter circuits 423. The reset signal /SCr is supplied to a gate electrode of the transistor 424. The pull-up pre-emphasis enable signal PEmpEnPu selects whether to perform a pre-emphasis operation at rising of the read data DQ. Therefore, in a case where the pull-up pre-emphasis enable signal PEmpEnPu is active at a high level, a one-shot signal EmpPu is generated from the one-shot-pulse generation circuit 420 in synchronization with a rising edge of the pull-up data DATAu. The one-shot-pulse generation circuit 420 does not use a NOR gate circuit that requires a plurality of P-channel MOS transistors connected in series, but is configured by using a NAND gate circuit that does not require a plurality of P-channel MOS transistors connected in series, and thus it is suitable for a high-speed operation.

The one-shot signal EmpPu and the pull-up data DATAu are input to the tristate buffer circuit 400 via logic circuits 430 and 440 and the logic circuit 450 that are included in the high-speed path 80. The logic circuit 430 includes a NAND gate circuit 431 that receives the one-shot signal EmpPu and the pull-up data DATAu, an inverter circuit 432, transistors 433 and 434 that reset the high-speed path 80, and transistors 435 and 436 that activate the NAND gate circuit 431 and the inverter circuit 432. The control signal /RSr*Hs is supplied to gate electrodes of the transistors 433 and 435. The control signal /SCr*Hs is supplied to gate electrodes of the transistors 434 and 436. The logic circuit 440 includes inverter circuits 441 and 442 connected to each other in cascade connection, transistors 443 and 444 that reset the high-speed path 80, and transistors 445 and 446 that activate the inverter circuits 441 and 442. The control signal /RSr*Hs is supplied to gate electrodes of the transistors 443 and 445. The control signal /SCr*Hs is supplied to gate electrodes of the transistors 444 and 446. The logic circuit 450 includes the NAND gate circuit 451, the NOR gate circuit 452, a transistor 453 that fixes a gate electrode of the transistor 403 at a high level, a transistor 454 that fixes a gate electrode of the transistor 404 at a low level, a transistor 455 that activates the NAND gate circuit 451, and transistors 456 and 457 that activate the NOR gate circuit 452. An output signal of the logic circuit 440 and a high-level fixed signal are input to the NAND gate circuit 451. The output signal of the logic circuit 440 and the control signal /(/SCr*Hs) are input to the NOR gate circuit 452. The control signal /SCr*Hs is supplied to gate electrodes of the transistors 453 and 455 to 457. The inverted signal /(/SCr*Hs) of the control signal /SCr*Hs is supplied to a gate electrode of the transistor 454. The power potential VDD2 lower than the boosted potential VCCP is used for the control signal /SCr*Hs used in the logic circuits 430 and 440, whereas the boosted potential VCCP is used for the control signal /SCr*Hs used in the logic circuit 450 and subsequent circuits for driving a thick film transistor. With this configuration, in a case where the speed mode signal Hs indicates a high-speed mode, the transistor 403 is temporarily turned on when the pull-up data DATAu changes to a high-level in a read operation. Therefore, the output transistor 71B is temporarily turned on, so that a pre-emphasis operation in a pull-up state is performed. On the other hand, in a case where the speed mode signal Hs indicates a low-speed mode, the output node of the tristate buffer circuit 400 is placed in a high-impedance state.

The tristate buffer circuit 410 belongs to the low-speed path 81 and includes transistors 411 to 415 that are connected in series to one another between a high-potential side power line and a low-potential side power line. The tristate buffer circuit 410 have the same circuit configuration as the tristate buffer circuit 400. The same signals as those input to the gate electrodes of the transistors 401, 402, and 405 are input to gate electrodes of the transistors 411, 412, and 415, except that the speed mode signal Hs is inverted.

The one-shot signal EmpPu and the pull-up data DATAu are input to the tristate buffer circuit 410 via logic circuits 460 and 470 included in the low-speed path 81. The logic circuit 460 includes a NAND gate circuit 461 that receives the one-shot signal EmpPu and the pull-up data DATAu, an inverter circuit 462, transistors 463 and 464 that reset the low-speed path 81, and transistors 465 and 466 that activate the NAND gate circuit 461 and the inverter circuit 462. The control signal /RSr*/Hs is supplied to gate electrodes of the transistors 463 and 465. The control signal /SCr*/Hs is supplied to gate electrodes of the transistors 464 and 466. The logic circuit 470 includes a NAND gate circuit 471, a NOR gate circuit 472, a transistor 473 that fixes a gate electrode of the transistor 413 at a high level, a transistor 474 that fixes a gate electrode of the transistor 414 at a low level, a transistor 475 that activates the NAND gate circuit 471, and transistors 476 and 477 that activate the NOR gate circuit 472. An output signal of the logic circuit 460 and a high-level fixed signal are input to the NAND gate circuit 471. The output signal of the logic circuit 460 and the control signal /(/SCr*/Hs) are input to the NOR gate circuit 472. The control signal /SCr*/Hs is supplied to gate electrodes of the transistors 473 and 475 to 477. The inverted signal /(/SCr*/Hs) of the control signal /SCr*/Hs is supplied to a gate electrode of the transistor 474. With this configuration, in a case where the speed mode signal Hs indicates a low-speed mode, the transistor 413 is temporarily turned on when the pull-up data DATAu changes to a high-level in a read operation. Therefore, the output transistor 71B is temporarily turned on, so that a pre-emphasis operation in a pull-up state is performed. On the other hand, in a case where the speed mode signal Hs indicates a high-speed mode, the output node of the tristate buffer circuit 410 is placed in a high-impedance state.

Further, the preemphasis circuit 23 includes N-channel MOS transistors 491 to 494 that reset the gate electrode of the output transistor 71B to a low level. The control signals /PwUp, Scr, /PEmpStr, and /SCr are supplied to gate electrodes of the transistors 491 to 494, respectively. The transistors 491, 492, and 494 are N-channel MOS transistors, each of which has a gate insulating film formed to be thick. Further, the amplitude of the control signal /PwUp input to the transistor 491 is not the boosted potential VCCP but the external power potential VDD1. Meanwhile, the amplitudes of the control signals SCr, /PEmpStr, and /SCr are VCCP.

In the pre-emphasis circuit 23, the driver circuits 54 to 56 are provided in parallel.

Figure 9:
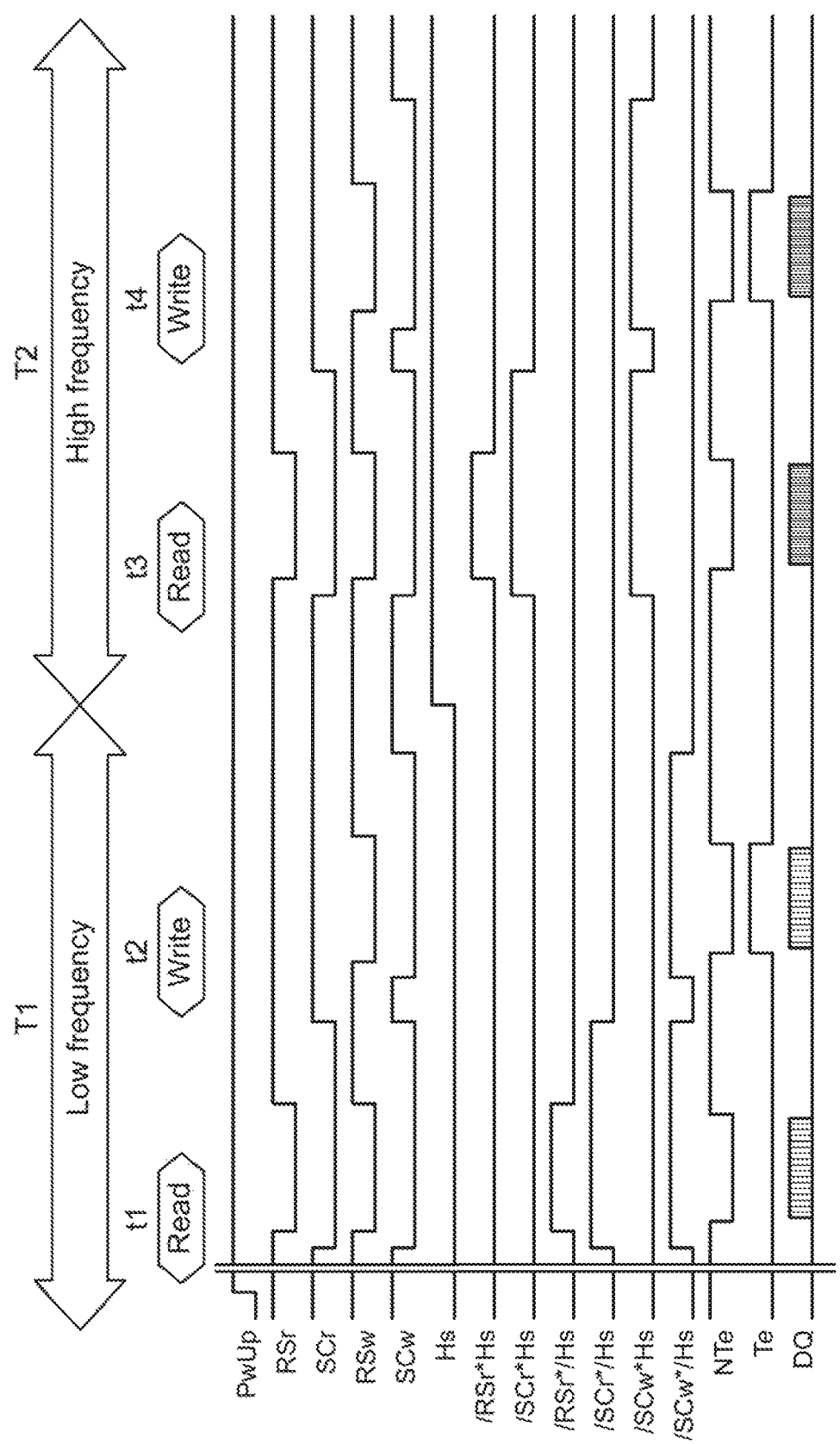
FIG. 9 is a timing chart for explaining an operation of the semiconductor device according to the present disclosure.

FIG. 9 is a timing chart for explaining an operation of the semiconductor device 10 according to the present disclosure.

In the example shown in FIG. 9, a read command and a write command are issued at times t1 and t2, respectively, and a read command and a write command are issued at times t3 and t4, respectively. The times t1 and t2 are included in a time period T1 during which an operation is performed in a low-speed mode, and the times t3 and t4 are included in a time period T2 during which an operation is performed in a high-speed mode. As shown in FIG. 9, when a read command has been issued, the reset signals RSr and SCr, a reset signal RSw, and the reset signal SCw are made inactive to a low level. Meanwhile, when a write command has been issued, the reset signals RSw and SCw are made inactive at a low level. Falling timings of the reset signals RSr and RSw are different from falling timings of the reset signals SCr and SCw. Similarly, rising timings of the reset signals RSr and RSw are different fem rising timings of the reset signals SCr and SCw. The reset signal RSr is at a high revel in a standby state, becomes low when a read operation is started, and returns to a high level when the read operation is ended. The reset signal SCr becomes low when a read operation is started, a little earlier than the reset signal RSr, and returns to a high level when the read operation is ended, quite later than the reset signal RSr. The reset signal RSw becomes low when a read operation or a write operation is started, and returns to a high level when the read operation or the write operation is ended. The reset signal SCw becomes low when a read operation or a write operation is started, a little earlier than the reset signal RSw, and returns to a high level when the read operation or the write operation is ended, quite later than the reset signal RSw.

When a read command has been issued, the read data DQ is output from the data terminal 15. When a write command has been issued, the write data DQ is input to the data terminal 15. Further, in a write operation, the target ODT enable signal Te is activated, so that a target ODT operation is performed. Furthermore, when neither a read operation nor a write operation is performed, the non-target ODT enable signal NTe is activated, so that a non-target ODT operation is performed.

Figure 10:
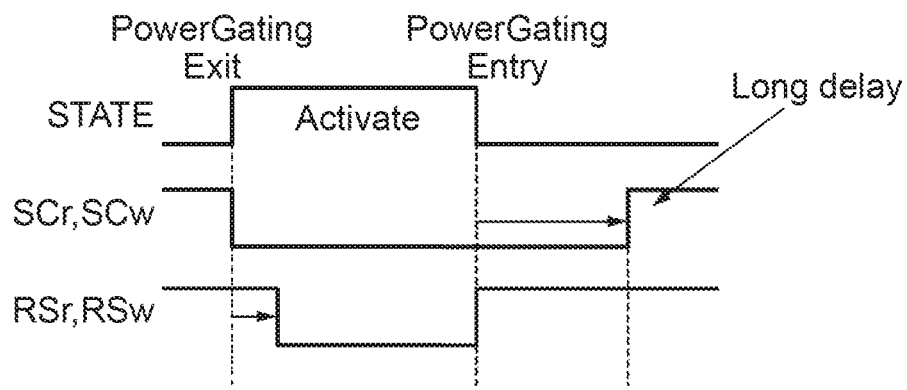
FIG. 10 is a timing chart showing a relation between a power gating operation and reset signals.

FIG. 10 is a waveform diagram showing a relation between the reset signals RSr and RSw and the reset signals SCr and SCw. As shown in FIG. 10, the reset signals SCr and SCw each define a timing of ending a power gating operation and causing transition of a corresponding logic circuit from an inactive state to an active state. Meanwhile, the reset signals RSr and RSw each define a timing of resuming a power gating operation and causing transition of a corresponding logic circuit from an active state to an inactive state. In each logic circuit, the reset signals RSr and RSw are input to a preceding stage and the reset signals SCr and SCw are input to a subsequent stage. Therefore, when a power gating operation is ended, a logic level of a signal output from each logic circuit is ensured. Meanwhile, because the reset signals SCr and SCw are input to transistors that use the boosted potential VCCP, they are kept at a low level for a relatively long time even after a power gating operation is resumed, so as not to cause increase of power consumption and cause hot carrier degradation because of repetition of turning-on and turning-off in a short period of time.

As shown in FIGS. 4 and 6 to 8, the control signal /RSr*Hs and the control signal /SCr*Hs activate the high-speed paths 80 and 82 in a read operation, and are used in the high-speed path 80 for the pull-up data DATAu and a portion of the high-speed path 82 for the pull-down data DATAd, the portion being not involved in a target ODT operation. The control signal /RSr*/Hs and the control signal /SCr*Hs activate the low-speed paths 81 and 83 in a read operation, and are used in the low-speed path 81 for the pull-up data DATAu and a portion of the low-speed path 83 for the pull-down data DATAd, the portion being not involved in a target ODT operation. The control signal /SCw*Hs activates the high-speed path 82 in a read operation or a write operation, and is used in a portion of the high-speed path 82 for the pull-down data DATAd, the portion being involved in a target ODT operation. The control signal /SCw*/Hs activates the low-speed path 83 in a read operation or a write operation, and is used in a portion of the low-speed path 83 for the pull-down data DATAd, the portion being involved in a target ODT operation.

Figure 11:
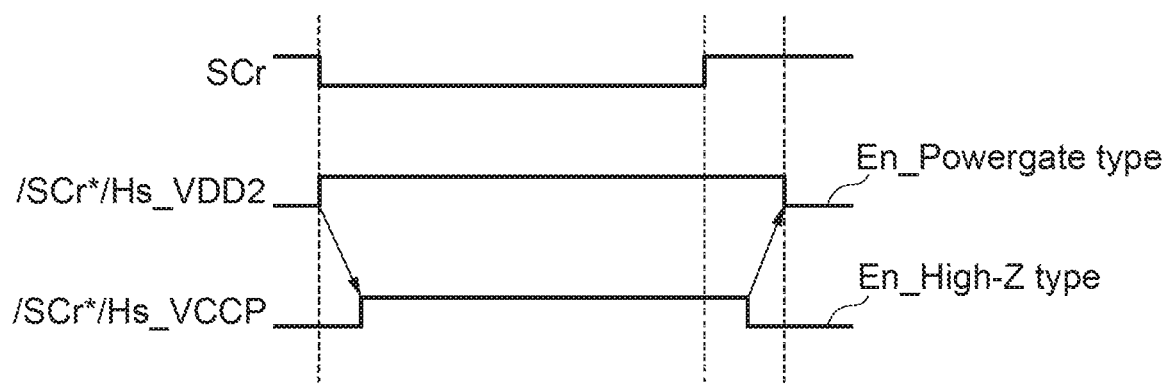
FIG. 11 is a timing chart showing an example in which a changing timing of a reset signal is changed by a potential.

The reset signal SCr may be divided into a signal input to a transistor that uses the boosted potential VCCP and a signal input to a transistor that uses the power potential VDD2. For example, as shown in FIG. 11, when the control signal /SCr*/Hs is generated based on the reset signal SCr, rising of a control signal /SCr*/Hs_VCCP to be input to a transistor that uses the boosted potential VCCP may be delayed from rising of a control signal /SCr*/Hs_VDD2 to be input to a transistor that uses the power potential VDD2, and falling of the control signal /SCr*/Hs_VDD2 may be delayed from falling of the control signal /SCr*/Hs_VCCP. With this setting, output of unknown data from the data terminal 15 is prevented when a power gating operation is ended.

Figure 12:
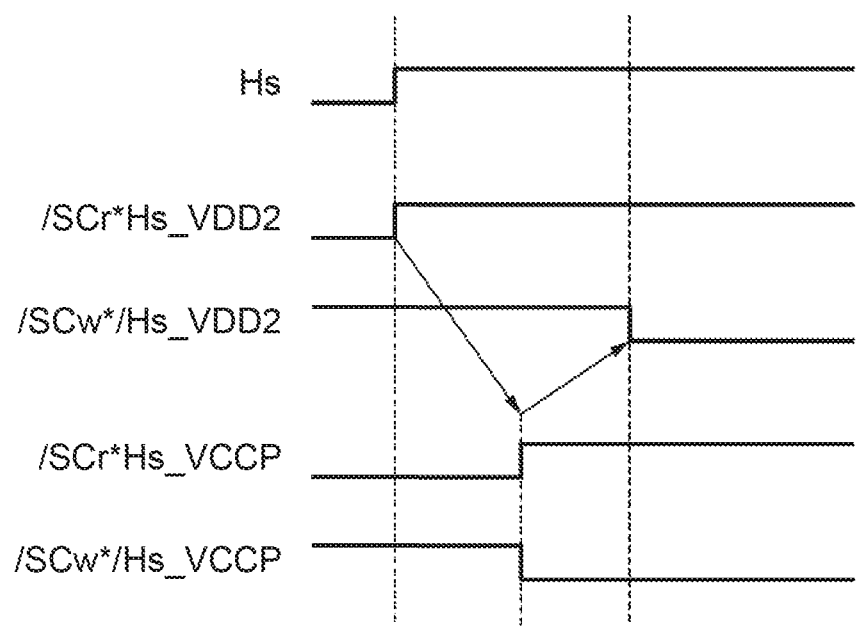
FIG. 12 is a timing chart showing a changing timing of a reset signal when the mode of a speed mode signal is switched.

Further, when a low-speed mode is switched to a high-speed mode or when a high-speed mode is switched to a low-speed mode, timings of transitions of various control signals generated by the reset signals SCr and SCw and the speed mode signal Hs may be placed in order. For example, as shown in FIG. 12, when a low-speed mode is switched to a high-speed mode, the control signal /SCr*Hs_VDD2 may be changed to a high level, thereafter the control signal /SCr*Hs_VCCP and the control signal /SCw*/Hs_VCCP may be changed to a high level and a low level, respectively, and thereafter the control signal /SCw*/Hs_VDD2 may be changed to a low level. With this order, output of unknown data from the data terminal 15 is prevented at switching from a low-speed mode to a high-speed mode or at switching from a high-speed mode to a low-speed mode.

Although this invention has been disclosed in the context of certain preferred embodiments and examples, it will be understood by those skilled in the art that the inventions extend beyond the specifically disclosed embodiments to other alternative embodiments and /or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a data terminal;
   a first output transistor connected between the data terminal and a first power line supplying a first power potential;
   a first tristate circuit including an output node connected to a control electrode of the first output transistor, a first pull-up transistor configured to drive the output node to a first logic level, and a first pull-down transistor configured to drive the output node to a second logic level, wherein the output node of the first tristate circuit is brought into a high-impedance state when a first mode signal is activated; and
   a second tristate circuit including an output node connected to the control electrode of the first output transistor, a second pull-up transistor configured to drive the output node to the first logic level, and a second pull-down transistor configured to drive the output node to the second logic level, wherein the output node of the second tristate circuit is brought into a high-impedance state when the first mode signal is deactivated,
   wherein the second pull-up and pull-down transistors have a different threshold voltage from the first pull-up and pull-down transistors.

2. The apparatus of claim 1,
   wherein the first mode signal is a non-target ODT signal, and
   wherein the second pull-up and pull-down transistors are higher in a threshold voltage than the first pull-up and pull-down transistors.

3. An apparatus comprising:
   a data terminal;
   a first output transistor connected between the data terminal and a first power line supplying a first power potential;
   a first tristate circuit including an output node connected to a control electrode of the first output transistor, a first pull-up transistor configured to drive the output node to a first logic level, and a first pull-down transistor configured to drive the output node to a second logic level; and
   a second tristate circuit including an output node connected to the control electrode of the first output transistor, a second pull-up transistor configured to drive the output node to the first logic level, and a second pull-down transistor configured to drive the output node to the second logic level, wherein the second pull-up and pull-down transistors have a different threshold voltage from the first pull-up and pull-down transistors, and wherein the first tristate circuit further includes a first switch transistor connected in series with the first pull-up transistor, and a second switch transistor connected in series with the first pull-down transistor, wherein a gate insulating film of the first and second switch transistors is thicker than a gate insulating film of the first pull-up and pull-down transistors, and wherein the first and second switch transistors have the same conductivity type as each other.

4. An apparatus comprising:
a data terminal;
a first output transistor connected between the data terminal and a first power line supplying a first power potential;
a first tristate circuit including an output node connected to a control electrode of the first output transistor, a first pull-up transistor configured to drive the output node to a first logic level, and a first pull-down transistor configured to drive the output node to a second logic level; and
a second tristate circuit including an output node connected to the control electrode of the first output transistor, a second pull-up transistor configured to drive the output node to the first logic level, and a second pull-down transistor configured to drive the output node to the second logic level,
wherein the second pull-up and pull-down transistors have a different threshold voltage from the first pull-up and pull-down transistors,
wherein the first tristate circuit further includes a first switch transistor connected in series with the first pull-up transistor, and a second switch transistor connected in series with the first pull-down transistor,
wherein the first tristate circuit further includes a first adjustment circuit connected between the first pull-up transistor and the first switch transistor, and a second adjustment circuit connected between the first pull-down transistor and the second switch transistor.

5. The apparatus of claim 4, wherein each of first and second adjustment circuits includes a plurality of adjustment transistors connected in parallel.

6. The apparatus of claim 5, wherein the adjustment transistors are controlled by a slew rate code signal.

7. The apparatus of claim 2, wherein one of the first pull-up and pull-down transistors is brought into an ON state based on a first data signal during a read operation.

8. The apparatus of claim 7, wherein the first pull-up transistor is brought into an ON state during a write operation.

9. The apparatus of claim 7, further comprising a third tristate circuit including an output node connected to the control electrode of the first output transistor, a third pull-up transistor configured to drive the output node to the first logic level, and a third pull-down transistor configured to drive the output node to the second logic level,
wherein the third pull-up and pull-down transistors have the same threshold voltage as the first pull-up and pull-down transistors, and
wherein one of the first and third tristate circuits is activated based on a second mode signal.

10. The apparatus of claim 9, wherein the second mode signal indicates a frequency of the first data signal.

11. The apparatus of claim 7, further comprising:
a second output transistor connected between the data terminal and a second power line supplying a second power potential; and
a fourth tristate circuit including an output node connected to a control electrode of the second output transistor, a fourth pull-up transistor configured to drive the output node to the first logic level, and a fourth pull-down transistor configured to drive the output node to the second logic level,
wherein the second pull-up and pull-down transistors are higher in a threshold voltage than the fourth pull-up and pull-down transistors.

12. The apparatus of claim 11, wherein one of the fourth pull-up and pull-down transistors is brought into ON state based on a second data signal that is an inverted signal of the first data signal.

13. An apparatus comprising:
a data terminal;
an output transistor connected between the data terminal and a first power line supplying a first power potential;
a first tristate circuit including an output node connected to a control electrode of the output transistor;
a second tristate circuit including an output node connected to the control electrode of the output transistor; and
a third tristate circuit including an output node connected to the control electrode of the output transistor,
wherein the first tristate circuit is activated when a speed mode signal indicates a high-speed mode,
wherein the second tristate circuit is activated when the speed mode signal indicates a low-speed mode, and
wherein the third tristate circuit is activated regardless of the speed mode signal when a non-target ODT signal is activated.

14. The apparatus of claim 13,
wherein each of the first and second tristate circuits includes first, second and third transistors connected in series between the control electrode of the output transistor and the first power line,
wherein the first transistor is controlled by a first signal,
wherein the second transistor is controlled by a second signal,
wherein the third transistor is controlled by a third signal, and
wherein a gate insulating film of the third transistor is thicker than a gate insulating film of the first and second transistors.

15. The apparatus of claim 14,
wherein each of the first and second tristate circuits further includes fourth, fifth and sixth transistors connected in series between the control electrode of the output transistor and a second power line supplying a second power potential,
wherein the fourth transistor is controlled by the first signal,
wherein the fifth transistor is controlled by the second signal,
wherein the sixth transistor is controlled by the third signal, and
wherein a gate insulating film of the sixth transistor is thicker than a gate insulating film of the fourth and fifth transistors.

16. The apparatus of claim 15,
wherein the first, second, third, and sixth transistors are a N-channel type, and wherein the fourth and fifth transistors are a P-channel type.

17. The apparatus of claim 16,
wherein the third tristate circuit includes a seventh transistor of an N-channel type and an eighth transistor of a P-channel type,
wherein drains of the seventh and eighth transistors are connected to the control electrode of the output transistor, and
wherein the seventh and eighth transistors are higher in a threshold voltage than the first and fourth transistors.

\* \* \* \* \*